(12) United States Patent
Kuo et al.

(10) Patent No.: US 12,546,939 B2
(45) Date of Patent: Feb. 10, 2026

(54) SEMICONDUCTOR PACKAGE AND MANUFACTURING METHOD THEREOF

(71) Applicant: Taiwan Semiconductor Manufacturing Company, Ltd., Hsinchu (TW)

(72) Inventors: Feng-Wei Kuo, Hsinchu County (TW); Wen-Shiang Liao, Miaoli County (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 464 days.

(21) Appl. No.: 18/166,460

(22) Filed: Feb. 8, 2023

(65) Prior Publication Data

US 2024/0201439 A1    Jun. 20, 2024

Related U.S. Application Data

(60) Provisional application No. 63/433,768, filed on Dec. 20, 2022.

(51) Int. Cl.
| | |
|---|---|
| G02B 6/124 | (2006.01) |
| G02B 6/136 | (2006.01) |
| H01L 23/00 | (2006.01) |
| H01L 25/00 | (2006.01) |
| H01L 25/065 | (2023.01) |
| G02B 6/12 | (2006.01) |

(52) U.S. Cl.
CPC ......... *G02B 6/1245* (2013.01); *G02B 6/136* (2013.01); *H01L 24/16* (2013.01); *H01L 24/73* (2013.01); *H01L 25/0657* (2013.01); *H01L 25/50* (2013.01); *G02B 2006/12104* (2013.01); *H01L 2224/16146* (2013.01); *H01L 2224/16225* (2013.01); *H01L 2224/73204* (2013.01); *H01L 2225/06517* (2013.01); *H01L 2225/06568* (2013.01)

(58) Field of Classification Search
CPC ....... G02B 6/1245; G02B 6/136; H01L 24/16; H01L 24/73; H01L 25/0657; H01L 25/50
See application file for complete search history.

(56) References Cited

U.S. PATENT DOCUMENTS

| | | | |
|---|---|---|---|
| 8,993,380 B2 | 3/2015 | Hou et al. | |
| 9,281,254 B2 | 3/2016 | Yu et al. | |
| 9,299,649 B2 | 3/2016 | Chiu et al. | |
| 9,372,206 B2 | 6/2016 | Wu et al. | |

(Continued)

*Primary Examiner* — Walter H Swanson
(74) *Attorney, Agent, or Firm* — JCIPRNET

(57) ABSTRACT

A semiconductor package and a manufacturing method thereof are provided. A die stack in the semiconductor package includes a photonic die and an electronic die stacked on the photonic die by a face-to-face manner. A convex lens is disposed at a back surface of the electronic die, and is formed in an oval shape, such that optical beams can be collimated to have circular beam shape, as passing through the convex lens. In some embodiments, the semiconductor package includes more of the die stacks, and includes an interposer lying below the die stacks. In these embodiments, tilted reflectors are formed in the photonic dies and the interposer, to set up vertical optical paths between the interposer and the photonic dies, and lateral optical paths in the interposer. In this way, optical communication between the photonic dies can be established.

20 Claims, 36 Drawing Sheets

(56) References Cited

U.S. PATENT DOCUMENTS

| | | |
|---|---|---|
| 9,425,126 B2 | 8/2016 | Kuo et al. |
| 9,443,783 B2 | 9/2016 | Lin et al. |
| 9,461,018 B1 | 10/2016 | Tsai et al. |
| 9,496,189 B2 | 11/2016 | Yu et al. |
| 9,666,502 B2 | 5/2017 | Chen et al. |
| 9,735,131 B2 | 8/2017 | Su et al. |
| 2018/0314003 A1* | 11/2018 | Coolbaugh .......... G02B 6/4232 |

* cited by examiner

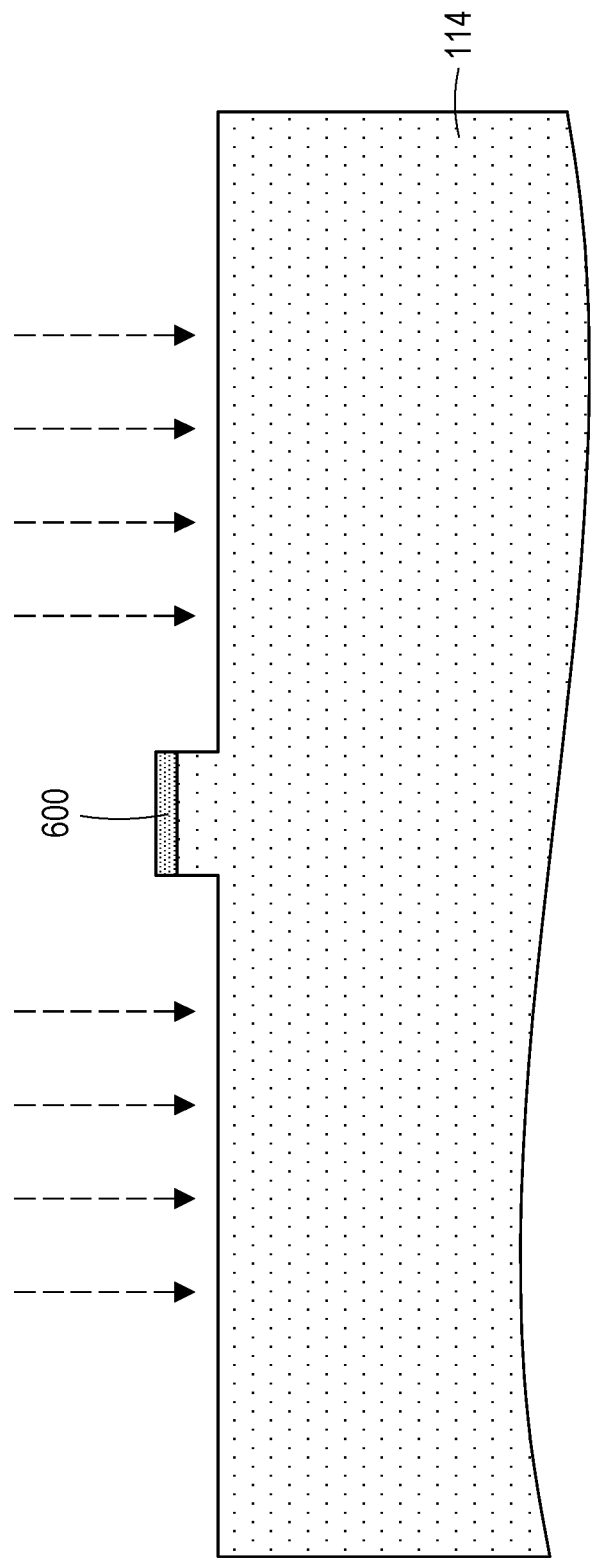

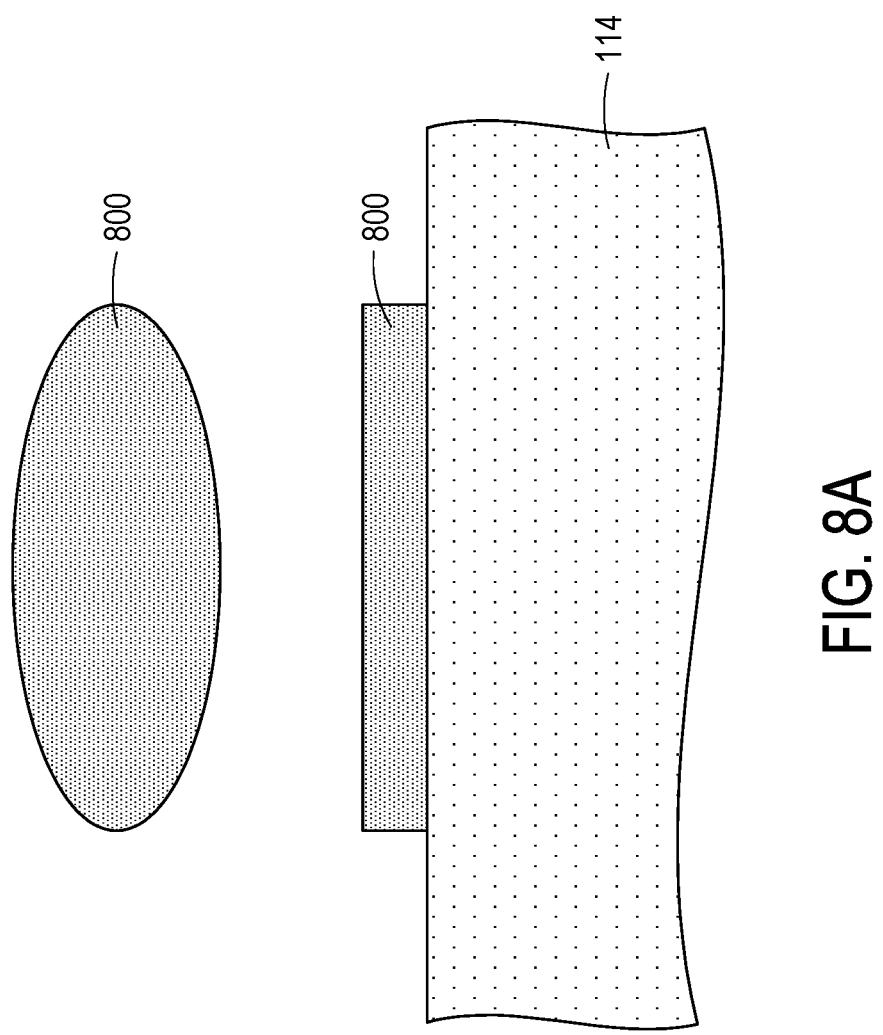

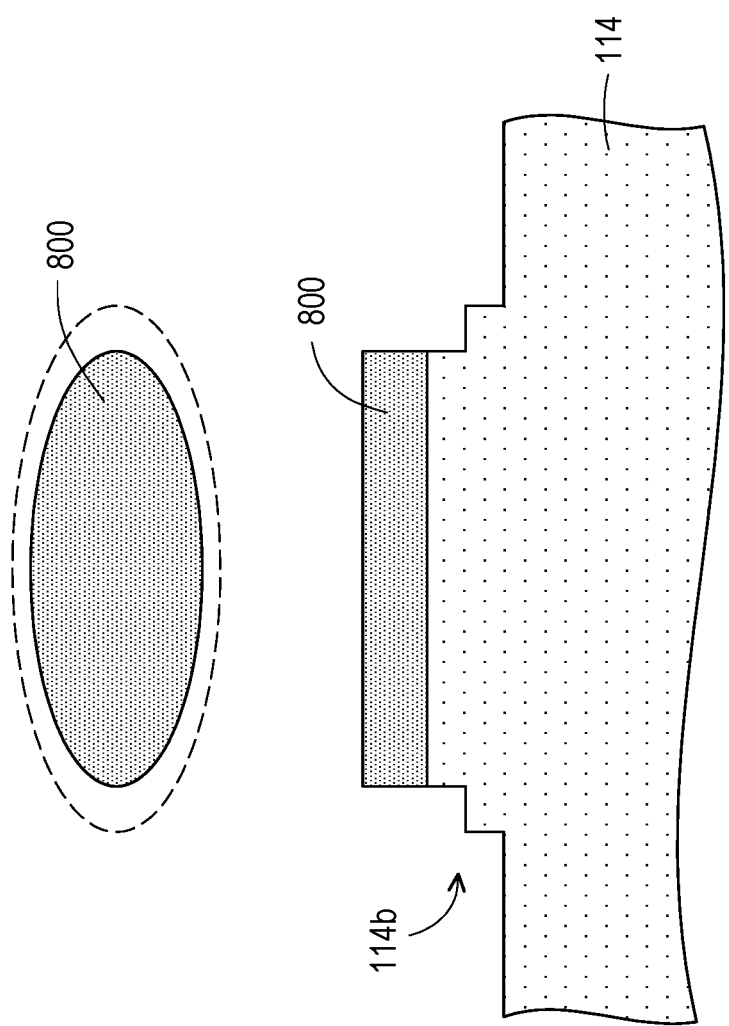

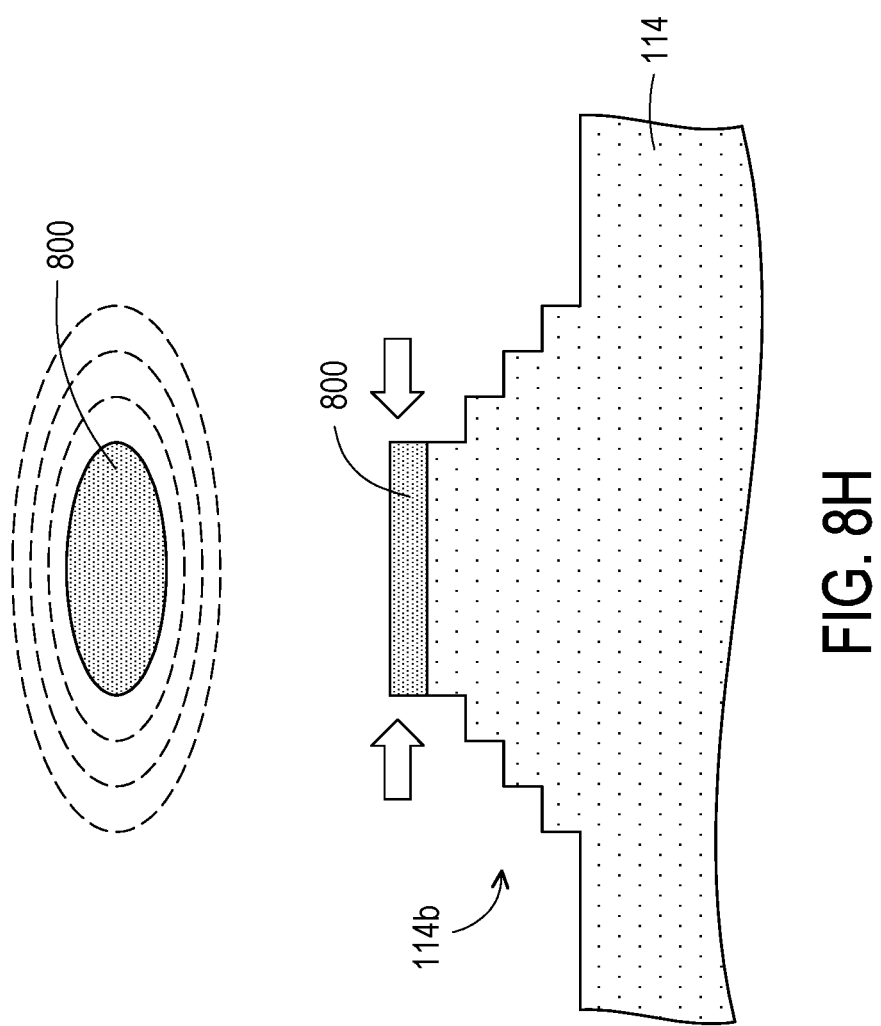

SEMICONDUCTOR PACKAGE AND MANUFACTURING METHOD THEREOF

CROSS-REFERENCE TO RELATED APPLICATION

This application claims the priority benefit of U.S. provisional application Ser. No. 63/433,768, filed on Dec. 20, 2022. The entirety of the above-mentioned patent application is hereby incorporated by reference herein and made a part of this specification.

BACKGROUND

Recently, optical signaling and processing have been widely used in many applications. As optical signaling and processing for long-range signal transmission are often combined with electrical signaling and processing for short-range signal transmission, a photonic die for optical signaling and processing and an electronic die for electrical signaling and processing are integrated in the same semiconductor package, to shorten signal path between the photonic die and the electronic die. Currently, there is still room for improving efficiency of optical signal coupling between the photonic die and an external fiber. Further, in certain cases, multiple photonic dies and at least one electronic die are included in the semiconductor package. Various approaches have been used to improve communication between the photonic dies and the electronic die(s). However, an efficient communication between the photonic dies is still required to be found.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 6A through FIG. 6J are schematic cross-sectional views illustrating intermediate structures at various stages during the process as shown in FIG. 5.

FIG. 8A through FIG. 8H schematically illustrate intermediate structures at various stages during the process shown in FIG. 7.

DETAILED DESCRIPTION

Figure 1A:
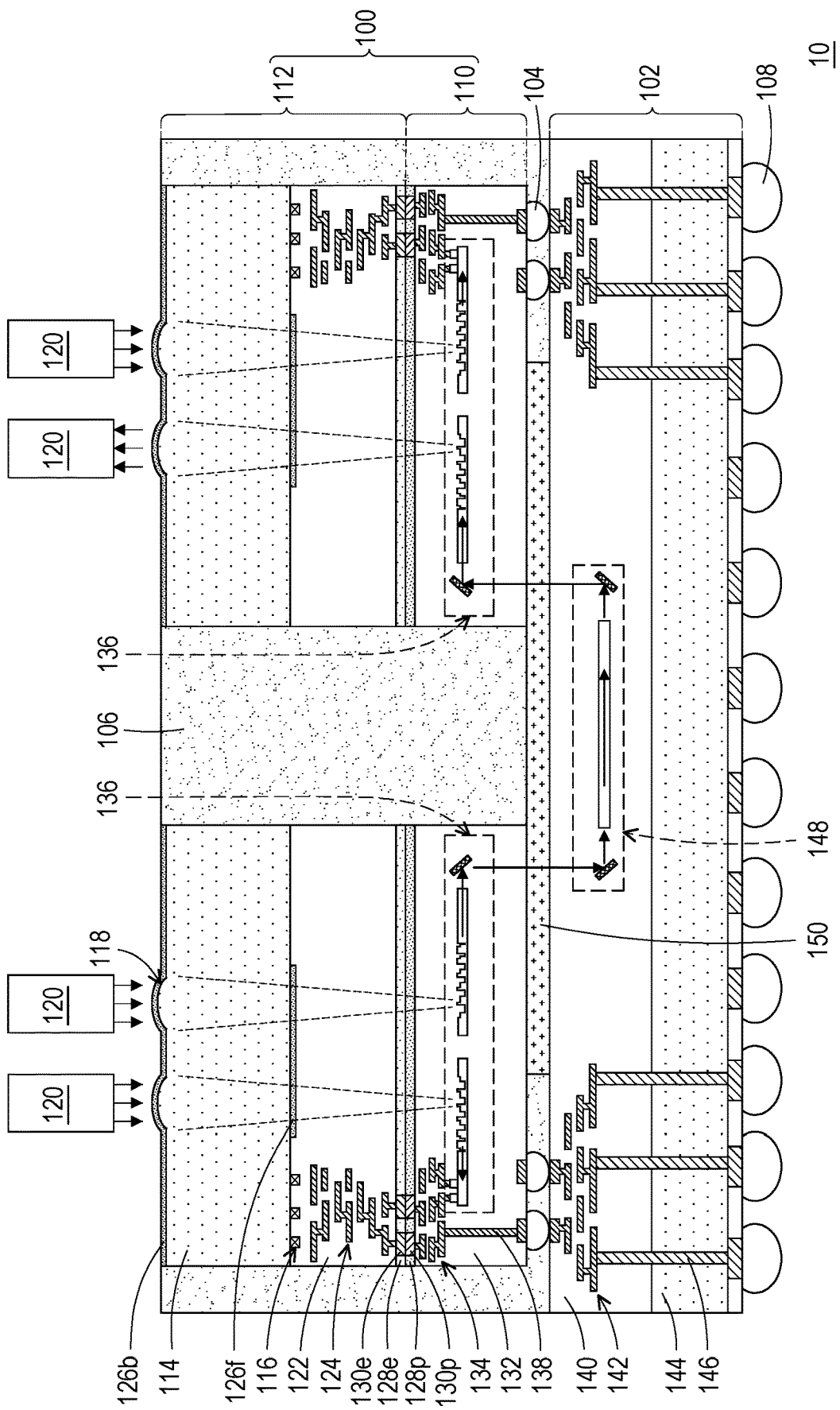
FIG. 1A is a schematic cross-sectional view illustrating a semiconductor package according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A three-dimensional semiconductor package with efficient die-to-die optical communication is provided according to various embodiments of the present disclosure. Particularly, the die-to-die optical communication includes lateral optical paths each extending in a photonic die or an interposer, and includes vertical optical paths each passing across an interface between a photonic die and an interposer.

FIG. 1A is a schematic cross-sectional view illustrating a semiconductor package 10 according to some embodiments of the present disclosure.

Referring to FIG. 1A, the semiconductor package 10 is a three-dimensional semiconductor package that includes multiple die stacks 100 and an interposer 102 lying below the die stacks 100. The die stacks 100 may be attached to the interposer 102 via electrical connectors 104, such as controlled collapse chip connection (C4) bumps. In addition, the die stacks 100 may be laterally spaced apart from one another, and are laterally surrounded by a gap filling material 106, such as polyimide, silicon oxide or any of other insulating materials.

In addition to provide support for the die stacks 100, the interposer 102 is further configured to establish optical communications between the die stacks 100. Moreover, electrical signals from the die stacks 100 may be routed to the other side of the interposer 102 along electrical paths passing through the interposer 102. Electrical connectors 108 may be deployed at the side of the interposer 102 facing away from the die stacks 100, such that the semiconductor package can be bonded to another package component (not shown) through the electrical connectors 108.

Each of the die stacks 100 includes a photonic die 110 attached to the interposer 102, and includes an electronic die 112 placed on top of the photonic die 110. In each die stack 100, the electronic die 112 is bonded to the photonic die 110 by its front side. A back side of the electronic die 112, which is defined by a back surface of a semiconductor substrate 114 facing away from active devices 116 arranged at a front surface of the semiconductor substrate 114, is formed with lens 118. Optical fibers 120 may be positioned on the lens 118. Lights emitted from the optical fibers 120 may enter the die stacks 100 through the lens 118, and are focused by the lens 118. Similarly, lights can leave the die stacks 110 to the optical fiber 120 through the lens 118, and can be collimated by the lens 118. The active devices 116 at the front surface of the semiconductor substrate 114 in each electronic die 112 may include transistors, such as metal-oxide-semiconductor field effect transistors (MOSFETs). For each electronic die 112, a stack of dielectric layers 122 may cover the front surface of the semiconductor substrate 114.

Interconnecting elements 124 including conductive lines and conductive via are distributed in the stack of the dielectric layers 122, to interconnect the active devices 116, and to establish electrical paths to a front side of the electronic die 112. As lights may pass through the electronic dies 112 to reach the photonic dies 110 (or pass through the electronic dies 112 to reach the optical fibers 120), the interconnecting elements 124 may be avoided from being placed within regions of the dielectric layers 122 through which the lights pass. Similarly, the active devices 116 may be avoided from being arranged within regions of the front surface of the semiconductor substrate 114 through which the lights pass.

According to some embodiments, an anti-reflection coating (ARC) 126b is provided across the back side of each electronic die 112 (e.g., the back surface of the semiconductor substrate 114 in each electronic die 112), such that the lights may enter/leave the electronic dies 112 through the ARC 126b, and optical loss due to reflection at the back sides of the electronic dies 112 can be reduced. Similarly, an ARC 126f may be provided on the front surface of the semiconductor substrate 114 in each electronic die 112. The ARC 126f in each electronic die 112 is positioned on the light paths, and are configured to reduce optical loss due to reflection at an interface between the semiconductor substrate 114 and the dielectric layers 122 covering the semiconductor substrate 114. In some embodiments, the ARC 126f in each electronic die 112 may not cover the entire semiconductor substrate 114, but may only be located at regions overlapped with the lens 118. Further, the active devices 116 may be located at other regions, rather than being covered by the ARCs 126f.

According to some embodiments, the electronic dies 112 are bonded to the photonic dies 110 via a hybrid bonding manner (i.e., a bonding manner involving dielectric-to-dielectric bonding and metal-to-metal bonding). In these embodiments, a bonding layer 128e formed of a dielectric material may be disposed along a bonding surface of each electronic die 112, which is also defined as the front side of each electronic die 112. In each electronic die 112, the bonding layer 128e may cover the stack of dielectric layers 122, and multiple bonding pads 130e electrically connected to the interconnecting elements 124 in the stack of dielectric layers 122 may be laterally surrounded by the bonding layer 128e. Similarly, a bonding layer 128p formed of a dielectric material may be disposed along a bonding surface of each photonic die 110, and multiple bonding pads 130p are laterally surrounded by the bonding layer 128p. The bonding pads 130p of each photonic die 110 are bonded with the bonding pads 130e of the overlying electronic die 112, respectively. In addition, the bonding layer 128p of each photonic die 110 is bonded with the bonding layer 128e of the overlying electronic die 112.

In addition to bonding features (e.g., the bonding layer 128p and the bonding pads 130p), each photonic die 110 includes a stack of dielectric layers 132 covered by the bonding elements. Further, each photonic die 110 includes interconnecting elements 134 and optical devices 136 embedded in the dielectric layers 132. The interconnecting elements 134, which may include conductive lines and conductive vias, provide electrical paths in the photonic dies 110, and electrical signals generated by the optical devices 136 can be routed to the bonding pads 130p through the interconnecting elements 134. According to some embodiments, the interconnecting elements 134 are connected to back sides of the photonic dies 110 facing away from the bonding features along through dielectric vias 138 (only a single one is depicted in each photonic die 110). The through dielectric vias 138 may respectively extend through multiple ones of the dielectric layers 132 in each photonic die 110, and are electrically connected to the electrical connectors 104 at the back sides of the photonic dies 110.

In some embodiments, a substrate (e.g., a semiconductor substrate) is absent in each photonic die 110. More specifically, a substrate (e.g., a semiconductor substrate) may provide support for the stack of dielectric layers 132 in early stages during manufacturing of each photonic die 110, but may be removed before placement of the electrical connectors 104. Accordingly, for each photonic die 110, the electrical connectors 104 may be disposed at a side of the stack of dielectric layers 132 facing away from the bonding features without the substrate in between.

However, in alternative embodiments, a substrate (e.g., a semiconductor substrate) for supporting the stack of dielectric layers 132 in each photonic die 110 may remain. As a result, for each photonic die 110, the electrical connectors 104 may be disposed at a back side of the substrate opposite to the stack of dielectric layers 132, and the through dielectric vias 138 may further extend through the substrate to establish electrical connection with the electrical connectors 104.

As functioned for optical signaling and processing, the optical devices 136 in the photonic dies 110 may direct optical signals, and may convert some of the optical signals to electrical signals.

Figure 1B:
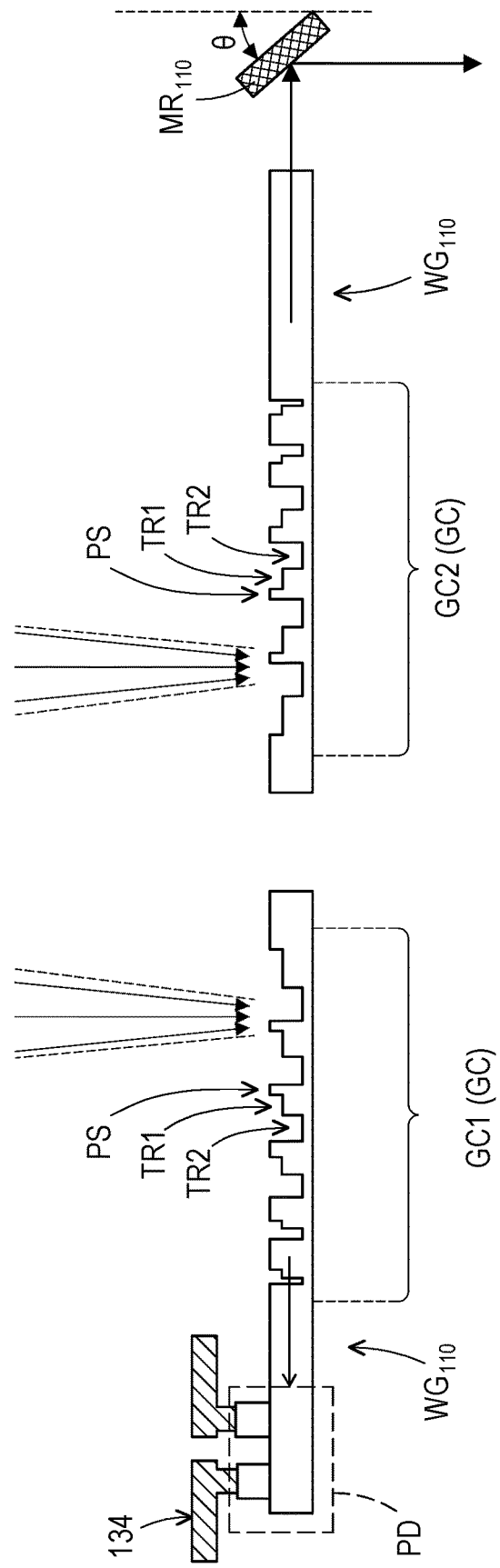
FIG. 1B is an enlarged cross-sectional view schematically illustrating some optical devices in a photonic die of the semiconductor package, according to some embodiments of the present disclosure.

FIG. 1B is an enlarged cross-sectional view schematically illustrating some of the optical devices 136 in one of the photonic dies 110, according to some embodiments of the present disclosure.

Referring to FIG. 1A and FIG. 1B, the optical devices 136 in each photonic die 110 include grating couplers GC and waveguides $WG_{110}$ connected to the grating couplers GC, respectively. The waveguides $WG_{110}$ may each be a dielectric pattern, a semiconductor pattern or a combination thereof. As an example, the waveguides $WG_{110}$ may be silicon patterns. The grating couplers GC are positioned on light paths reaching into the photonic dies 110 from the lens 118 of the electronic dies 112, and are configured to couple light emitted from the fibers 120 to the waveguides $WG_{110}$ or couple light transmitted along the waveguides $WG_{110}$ to the fibers 120. Each of the grating couplers GC is a material pattern (e.g., a silicon pattern) with pairs of shallow trenches TR1 and deep trenches TR2 recessing into the material pattern from a top surface of the material pattern. The shallow trenches TR1 and the deep trenches TR2 in each pair are arranged side-by-side and are communicative with each other, and adjacent pairs of the shallow trenches TR1 and the deep trenches TR2 are laterally spaced apart. As a result, pillar structures PS respectively stand between adjacent pairs of the trenches TR1, TR2. In order to direct light to a certain direction, widths of the trenches TR1, TR2 and the pillar structures PS may vary along a light transmission direction. For instance, as shown in FIG. 1B, one of the grating couplers GC (referred to as a grating coupler GC1) directs light toward the waveguide $WG_{110}$ connected to a left end of the grating coupler GC1. The widths of the trenches TR1, TR2 in the grating coupler CG1 may gradually decrease toward the left end of the grating coupler GC1, while the widths of the pillar structures PS in the grating coupler GC1 may gradually increase toward the left end of the grating coupler GC1. As another example, another one of the grating couplers GC (referred to as a grating coupler GC2) may direct light toward the waveguide $WG_{110}$ connected to a right end of the grating coupler GC2, and widths of the trenches TR1, TR2 in the grating coupler GC2 may gradually decrease toward the right end of the grating coupler GC2, while the widths of the pillar structures PS in the grating coupler GC2 may gradually increase toward the right end of the grating coupler GC2.

In some embodiments, the optical devices 360 in each photonic die 110 may further include photodetectors PD (only a single one is shown), such as photodiodes. The photodetectors PD may respectively be connected to one of the grating couplers GC (e.g., the grating coupler GC1) via the waveguide $WG_{110}$ in between. Optical signals directed to the photodetectors PD can be converted to electrical signals by the photodetectors PD. Further, these electrical signals generated in each photonic die 110 can be routed to the overlying electronic die 112 via the interconnecting elements 134 and the bonding features (e.g., the bonding pads 130p), and/or routed to the interposer 102 through the interconnecting elements 134, the through dielectric vias 138 and the electrical connectors 104, as described with reference to FIG. 1A.

While some of the optical signals provided to one of the photonic dies 110 are converted to electrical signals, others of the optical signals may be directed to one or more of other photonic dies 110 through optical paths in the interposer 102. In each photonic die 110, incident optical signals are coupled to the laterally extending waveguides $WG_{110}$, thus travel along one or more lateral direction(s) in the waveguides $WG_{110}$. In order to establish vertical optical paths from the photonic dies 110 to the interposer 102 and vice versa, tilted reflectors $MR_{110}$ are disposed in the photonic dies 110. As an example shown in FIG. 1B, one of the tilted reflectors $MR_{110}$ is laterally adjacent to the waveguide $WG_{110}$ connected to the grating coupler GC2 in one of the photonic dies 110. An optical signal is coupled to this waveguide $WG_{110}$ via the grating coupler GC2, and is emitted from this waveguide $WG_{110}$ along a lateral path. This tilted reflector $MR_{110}$ is placed on this lateral path, such that this optical signal can be reflected by this tilted reflector $MR_{110}$, and directed to leave this photonic die 110 from bottom. Accordingly, this optical signal can be directed to the underlying interposer 102. Similarly, as will be further described with reference to FIG. 1C, optical signals provided to another one of the photonic dies 110 from the interposer 102 can be re-directed to a lateral direction by another tilted reflector $MR_{110}$, and can be transmitted along the waveguide $WG_{110}$ adjacent to this tilted reflector $MR_{110}$, then coupled to the overlying optical fiber 120 by the grating coupler GC connected to this waveguide $WG_{110}$. In order to bend light from a lateral direction to a vertical direction (or vice versa), each tilted reflector $MR_{110}$ as a plate pattern formed of a reflective material (e.g., Al, Cu, Co, Ni, Ti, W, the like or combinations thereof) may have a major reflective surface tilted from a vertical axis by an angle $\theta$ greater than 0° and less than 90°. According to some embodiments, the angle $\theta$ is equal to or approximately 45°.

Referring back to FIG. 1A, the interposer 102 lying below the photonic dies 110 may include a stack of dielectric layers 140. Conductive features 142 (e.g., a combination of conductive lines and conductive vias) distributed in the stack of dielectric layers 140 may be electrically connected to the electrical connectors 104 between the interposer 104 and the photonic dies 110, such that electrical signals from the photonic dies 110 can be further routed through the conductive features 142. According to some embodiments, a substrate 144 (e.g., a semiconductor substrate) provides support for the stack of dielectric layers 140 from below. In these embodiments, through substrate vias 146 may extend through the substrate 144 to reach the conductive features 142 in the stack of dielectric layers 140, such that the electrical signals from the photonic dies 110 can be routed to the electrical connectors 108 at the other side of the interposer 102 through the conductive features 142 and the through substrate vias 146. In alternative embodiments, the substrate 144 may be removed during fabrication of the interposer 102. In these alternative embodiments, the electrical connectors 108 may be disposed at a side of the stack of dielectric layers 140 facing away from the photonic dies 110, and the through substrate vias 146 may be omitted or replaced by through dielectric vias extending in the stack of dielectric layers 140 and connecting the conductive features 142 to the electrical connectors 108.

Figure 1C:
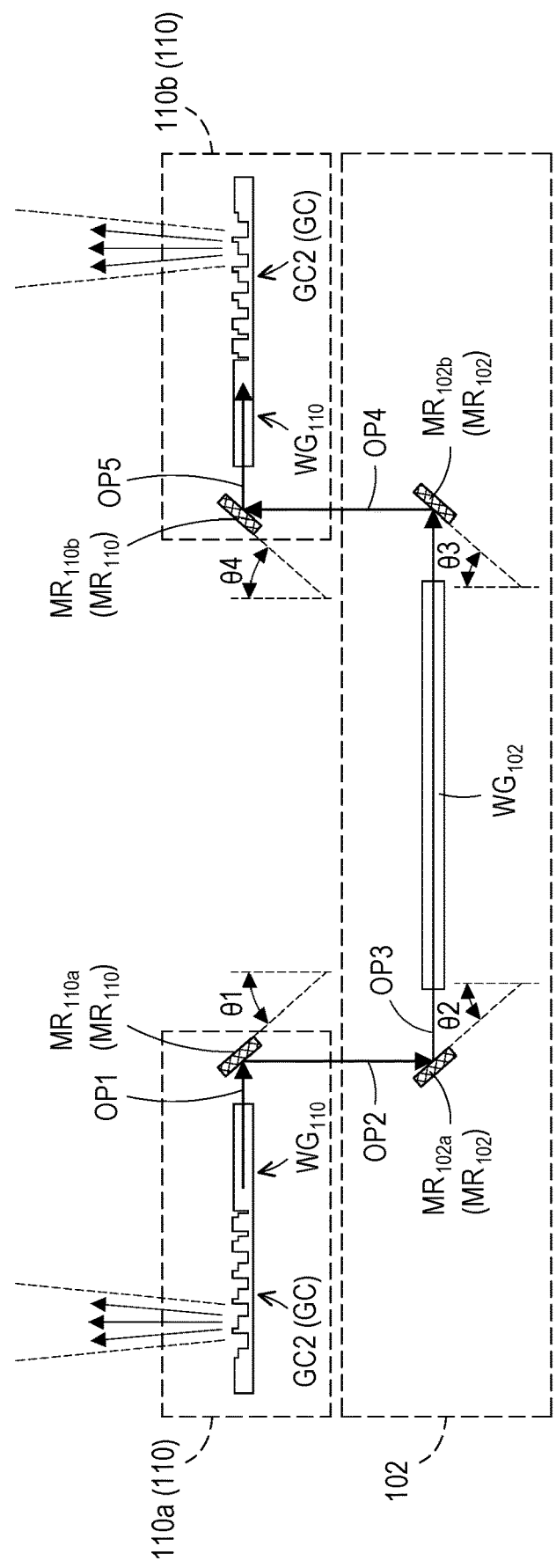
FIG. 1C is an enlarged schematic cross-sectional view illustrating optical paths from a photonic die to another in the semiconductor package, according to some embodiments of the present disclosure.

In addition to electrical routing, the interposer 102 also provides optical paths between the photonic dies 110. Optical devices 148, which will be described in further details with reference to FIG. 1C, are embedded in the stack of dielectric layers 140, for directing the optical signals between the photonic dies 110. In some embodiments, a dielectric layer 150 is filled in a spacing between the interposer 102 and the overlying photonic dies 110, such that the optical signals traveling between the interposer 102 and the overlying photonic dies 110 may pass through the dielectric layer 150, and an optical loss between the interposer 102 and the photonic dies 110 can be effectively reduced. In these embodiments, the electrical connectors 104 may be located around and laterally spaced apart from the dielectric layer 150. In addition to be sandwiched between the interposer 102 and the photonic dies 110, the dielectric layer 150 may further extend between the photonic dies 110 along a top surface of the interposer 102. As an example, the dielectric layer 150 may be a gel pattern comprising silicon oxide.

FIG. 1C is an enlarged schematic cross-sectional view illustrating optical paths from one of the photonic dies 110 (referred to as a photonic die 110a) to another (referred to as a photonic die 110b), according to some embodiments of the present disclosure.

Referring to FIG. 1A and FIG. 1C, as an example, an optical signal is transmitted along a lateral optical path OP1 in the waveguide $WG_{110}$ connected to the grating coupler GC2 in the photonic die 110a, and is re-directed by the tilted reflector $MR_{110}$ near this waveguide $WG_{110}$ (referred to as a tilted reflector $MR_{110a}$). Accordingly, this optical signal may leave the photonic die 110a then enter the underlying interposer 102 along a vertical optical path OP2. The optical devices 148 in the interposer 102 may further re-direct this optical signal at least twice before this optical signal is sent to the photonic die 110b. In some embodiments, the optical devices 148 in the interposer 102 include waveguides $WG_{102}$ (only a single one is shown) laterally extending between the separated photonic dies 110, and include pairs of tilted reflectors $MR_{102}$ at opposite sides of each waveguide $WG_{102}$ (only a single pair is shown). As similar to the waveguides $WG_{110}$ in the photonic dies, the waveguides $WG_{102}$ for transmitting optical signals may be material patterns formed of a dielectric material, a semiconductor material (e.g., silicon) or a combination thereof. In addition, as similar to the tilted reflectors $MR_{110}$ in the photonic dies 110, the tilted reflectors $MR_{102}$ for deflecting optical signals may be plate patterns form of a reflective material (e.g., Al, Cu, Co, Ni, Ti, W, the like or combinations thereof). One of the tilted reflectors $MR_{102}$ in each pair is configured to re-direct an optical signal from one of the overlying photonic dies 110 to the laterally extending waveguide $WG_{102}$ with an end adjacent to this tilted reflector $MR_{102}$, while the other tilted reflector $MR_{102}$ in the same pair further deflects this optical signal emitted from the other end of this waveguide $WG_{102}$, and sends this optical signal to another one of the overlying photonic dies 110.

In the example shown in FIG. 1C, the optical signal from the photonic die 110a may enter the interposer 102 along the vertical optical path OP2, and is re-directed to a lateral optical path OP3 by one of the tilted reflectors $MR_{102}$ at opposite sides of one of the waveguides $WG_{102}$ (referred to as a tilted reflector $MR_{102a}$), so as to enter and travel along this waveguide $WG_{102}$. As leaving this waveguide $WG_{102}$ along the lateral optical path OP3, this optical signal is deflected to a vertical optical path OP4 by the tilted reflector $MR_{102}$ at the other side of this waveguide $WG_{102}$ (referred to as a tilted reflector $MR_{102b}$), so as to be sent to the overlying photonic die 110b. One of the tilted reflectors $MR_{110}$ in the photonic die 110b (referred to as a tilted reflector $MR_{110b}$) then re-directs this optical signal from the interposer 102 to a lateral optical path OP5, such that this optical signal can enter the adjacent waveguide $WG_{110}$, and coupled to the overlying optical fiber 120 (shown in FIG. 1A) via the grating coupler GC2 connected to this waveguide $WG_{110}$. In this way, the optical signal passes from one of the photonic dies 110 to another along the optical paths OP1, OP2, OP3, OP4 and OP5. The lateral optical paths OP1, OP5 are located in the photonic dies 110a, 110b, whereas the lateral optical path OP3 is located in the interposer. On the other hand, the vertical optical paths OP2, OP4 each extend through an interface between the interposer 102 and one of the photonic dies 110a, 110b.

The tilted reflector $MR_{102a}$ in the interposer 102 may be overlapped with the tilted reflector $MR_{110a}$ in the photonic die 110a. The tilted reflectors $MR_{110a}$, $MR_{102a}$ may both tilt from a vertical axis counterclockwise. An angle θ2 between a major reflective surface of the tilted reflector $MR_{102a}$ and a vertical axis is greater than 0° and less than 90°, such as approximately equal to 45°. In some embodiments, the tilted reflector $MR_{102a}$ is substantially parallel with the overlapping tilted reflector $MR_{110a}$. In these embodiments, the angle θ2 by which the tilted reflector $MT_{102a}$ inclines is substantially equal with an angle θ1 by which the tilted reflector $MR_{110a}$ inclines. In alternative embodiments, the tilted reflectors $MR_{110a}$, $MR_{102a}$ are arranged with different inclinations, and the angle θ2 is larger or smaller than the angle θ1. Similarly, the tilted reflector $MR_{102b}$ in the interposer 102 may be overlapped with the tilted reflector $MR_{110b}$ in the photonic die 110b. The tilted reflectors $MR_{110b}$, $MR_{102b}$ may both tilt from a vertical axis clockwise. An angle θ3 between a major reflective surface of the tilted reflector $MR_{102b}$ and a vertical axis is greater than 0° and less than 90°, such as approximately equal to 45°. In some embodiments, the tilted reflector $MR_{102b}$ is substantially parallel with the overlapping tilted reflector $MR_{110b}$. In these embodiments, the angle θ3 by which the tilted reflector $MT_{102b}$ inclines is substantially equal with an angle θ4 by which the tilted reflector $MR_{110b}$ inclines. In alternative embodiments, the tilted reflectors $MR_{110b}$, $MR_{102b}$ are arranged with different inclinations, and the angle θ3 is larger or smaller than the angle θ4.

Furthermore, in some embodiments, the tilted reflector $MR_{110a}$ is in mirror symmetry to the tilted reflector $MR_{110b}$ with respect to a central vertical axis (not shown) between the photonic dies 110a, 110b. Similarly, the tilted reflectors $MR_{102a}$, $MR_{102b}$ in the interposer 102 may be in mirror symmetry with respect to the central vertical axis.

As described above, optical signals can be directed between the photonic dies 110 by using the waveguides $WG_{110}$, $WG_{102}$ and the tilted reflectors $MR_{110}$, $MR_{102}$ disposed in the photonic dies 110 and the underlying interposer 102, without being subjected to electrical-optical conversion. Therefore, speed and energy efficiency of the optical communication between the photonic dies 110 can be significantly improved. In detail, optical signals are transmitted in each of the waveguides $WG_{110}$, $WG_{102}$ along a lateral direction. The waveguides $WG_{102}$ in the interposer 102 lies below the waveguides $WG_{110}$ in the photonic dies 110, and the tilted reflectors $MR_{110}$, $MR_{102}$ are configured to direct optical signals between the vertically separated waveguides $WG_{110}$, $WG_{102}$. In other words, the tilted reflectors $MR_{110}$, $MR_{102}$ each deflect light from a lateral direction to a vertical direction (or vice versa), thus are designed to be inclined with respect to a vertical axis.

Figure 2:
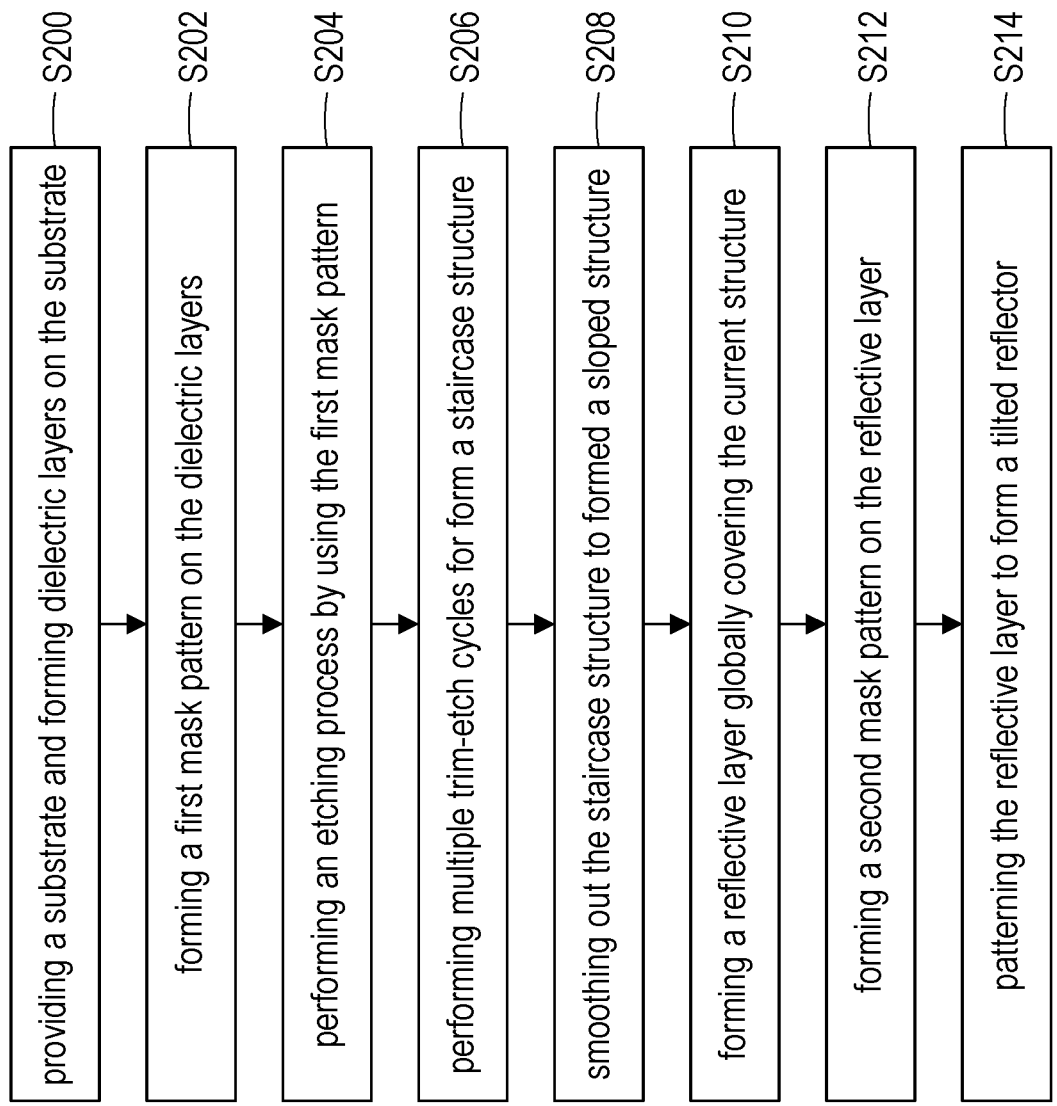
FIG. 2 is a flow diagram illustrating a process for forming a tilted reflector in the semiconductor package for deflecting optical signals, according to some embodiments of the present disclosure.

FIG. 2 is a flow diagram illustrating a process for forming one of the tilted reflectors $MR_{110}$, $MR_{102}$, according to some embodiments of the present disclosure. FIG. 3A through FIG. 3H are schematic cross-sectional views illustrating intermediate structures at various stages during the process shown in FIG. 2.

Figure 3A:
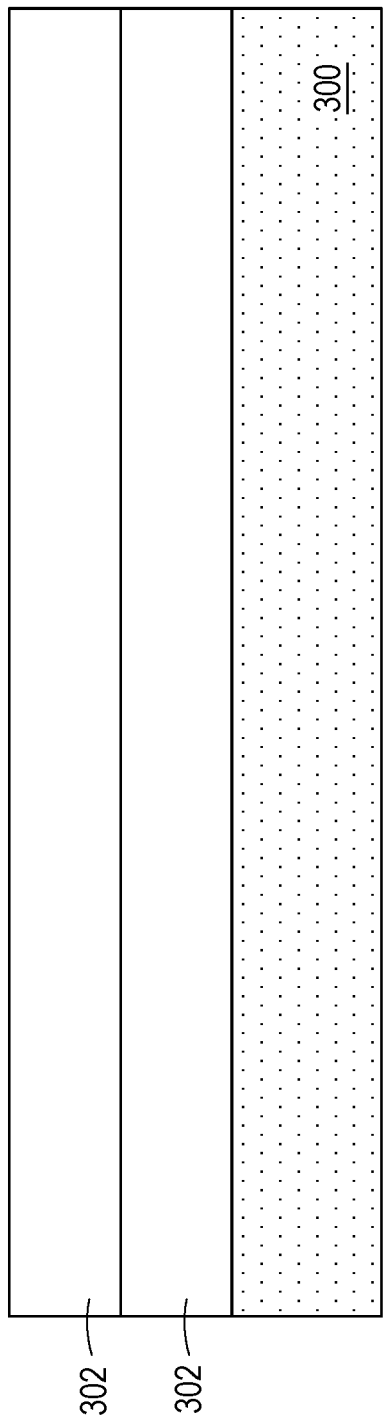
FIG. 3A through FIG. 3H are schematic cross-sectional views illustrating intermediate structures at various stages during the process shown in FIG. 2.

Referring to FIG. 2 and FIG. 3A, at a step S200, a substrate 300 is provided and dielectric layers 302 are formed on the substrate 300. The substrate 300 may be a substrate for one of the photonic dies 110, and may or may not be removed in further process steps for finishing manufacturing of the photonic die 110. In addition, the dielectric layers 302 may be a sub-set of the dielectric layers 132 lying below the tilted reflectors $MR_{110}$. In another case, the substrate 300 may be the substrate 144 of the interposer 102, and the dielectric layers 302 may be a sub-set of the dielectric layers 140 lying below the tilted reflectors $MR_{102}$. As described above, the substrate 144 may or may not remain in the finalized interposer 102. According to some embodiments, the dielectric layers 302 include silicon oxide, and are each formed by a deposition process (e.g., a chemical vapor deposition (CVD) process or a liquid phase deposition (LPD)) or a spin coating process.

Figure 3B:
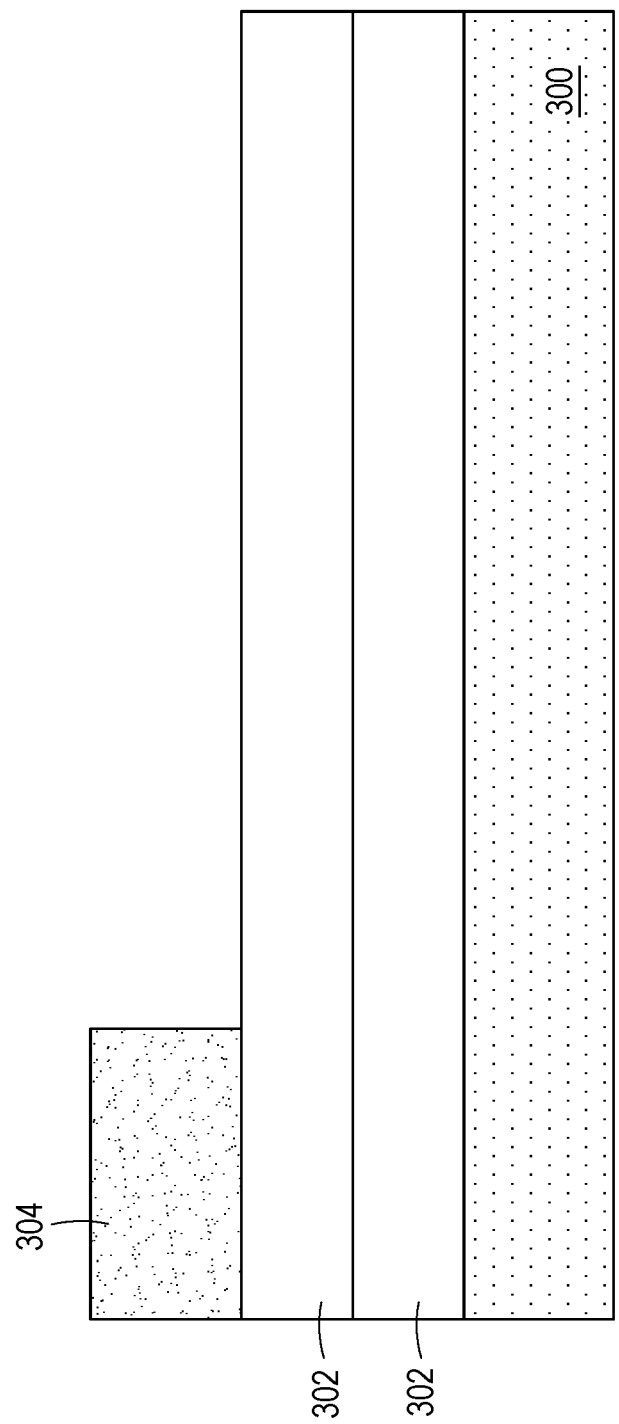

Referring to FIG. 2 and FIG. 3B, at a step S202, a mask pattern 304 is formed on the dielectric layers 302. As an example, the mask pattern 304 is a photoresist pattern, and a coating process as well as a lithography process may be used for forming the mask pattern 304.

Figure 3C:
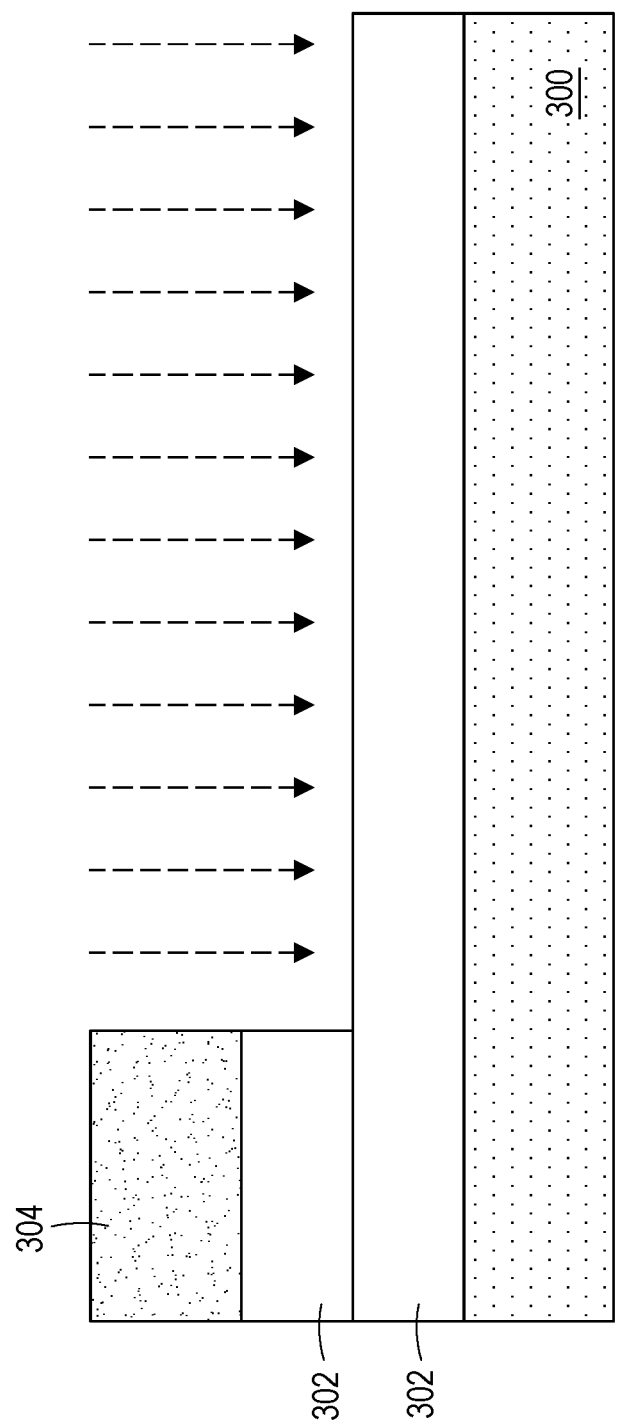

Referring to FIG. 2 and FIG. 3C, at a step S204, an etching process is performed. Portions of the topmost dielectric layer 302 not being covered by the mask pattern 304 are removed during the etching process, whereas portions of the topmost dielectric layer 302 overlapped with the mask pattern 304 remain. As a result, portions of the underlying dielectric layer 302 not overlapped with the mask pattern 304 are exposed, and a single step pattern is defined by the patterned dielectric layer 302 and the underlying dielectric layer 302.

Figure 3D:
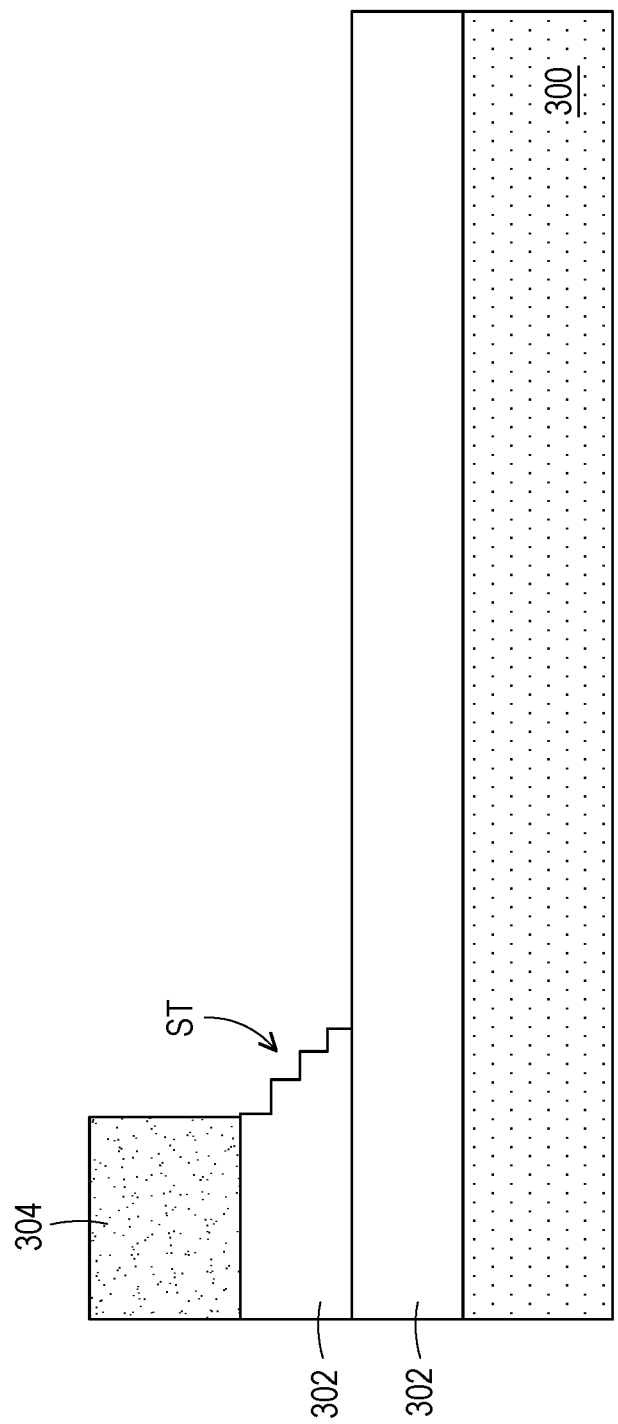

Referring to FIG. 3 and FIG. 3D, at a step S206, multiple trim-etch cycles are performed. In a first one of the trim-etch cycles, the mask pattern 304 is laterally recessed from the sidewall of the topmost dielectric layer 302 as shown in FIG. 3C to expose a peripheral region of the topmost dielectric layer 302, then exposed portion of the top dielectric layer 302 is vertically recessed from a top surface of the topmost dielectric layer 302. In a following trim-etch cycle, the mask pattern 304 is laterally recessed more to expose more of the topmost dielectric layer 302, then the previously recessed portion as well as the newly exposed portion of the topmost dielectric layer 302 are vertically recessed. As the trim-etch cycle is repeated multiple times, a staircase structure ST including multiple steps is formed at a side of the topmost dielectric layer 302, and the remained mask pattern 304 may be completely removed by a stripping process or an ashing process. Although not shown, while forming the staircase structure ST, exposed portions of the underlying dielectric layer 302 may be slightly recessed.

Figure 3E:
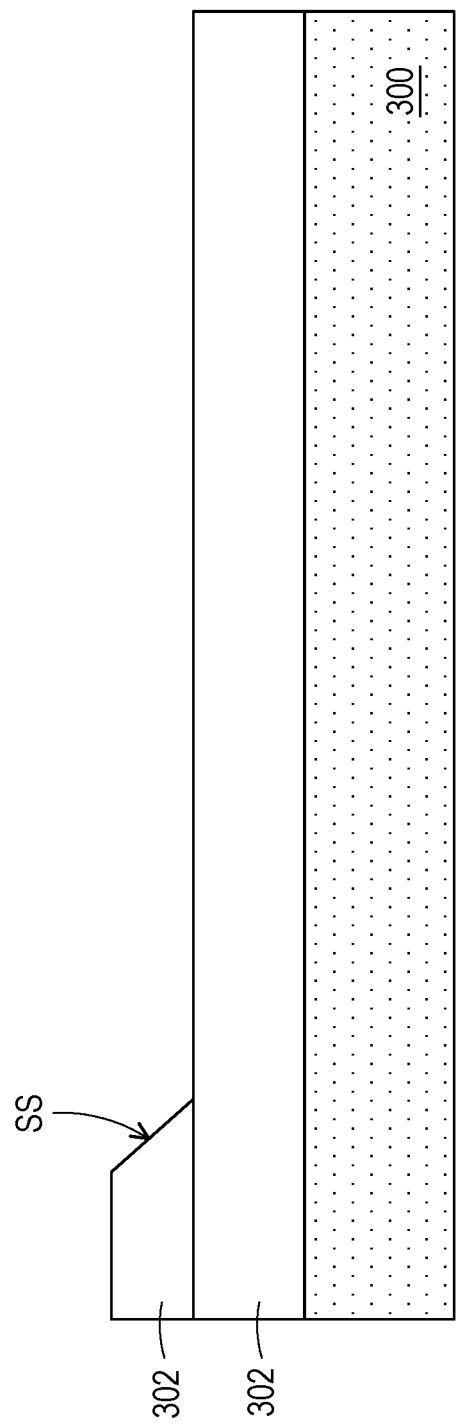

Referring to FIG. 2 and FIG. 3E, at a step S208, the staircase structure ST is substantially smoothed out. As a result, the staircase structure ST turns out to be a sloped structure. In other words, the topmost dielectric layer 302 currently has a sloped sidewall SS. In some embodiments, an isotropic etching process is involved for smoothing out the staircase structure ST. Although not shown, a top surface of the topmost dielectric layer 302 and an exposed top surface of the underlying dielectric layer 302 may be slightly recessed as a result of the isotropic etching process.

Figure 3F:
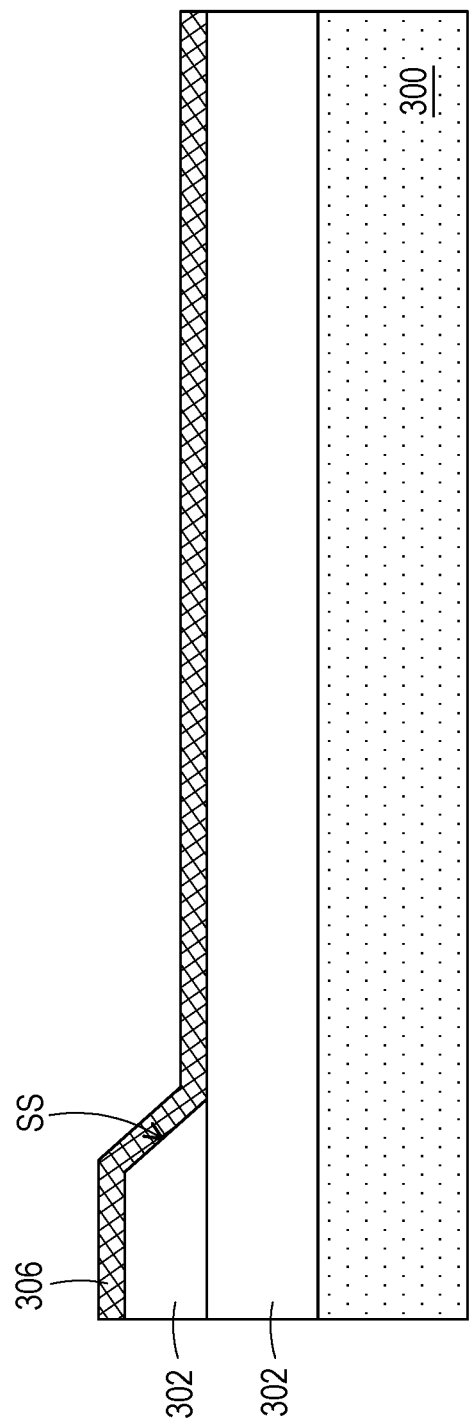

Referring to FIG. 2 and FIG. 3F, at a step S210, a reflective layer 306 is globally formed on the current structure. Accordingly, the top surface and the sloped sidewall SS of the topmost dielectric layer 302 as well as the exposed top surface of the underlying dielectric layer 302 are covered by the reflective layer 306. In following steps, the reflective layer 306 will be patterned to form a tilted reflector (e.g., one of the tilted reflectors $MR_{110}$, $MR_{102}$). Currently, the reflective layer 306 may be formed by a deposition process, such as a physical vapor deposition (PVD) process or a CVD process.

Figure 3G:
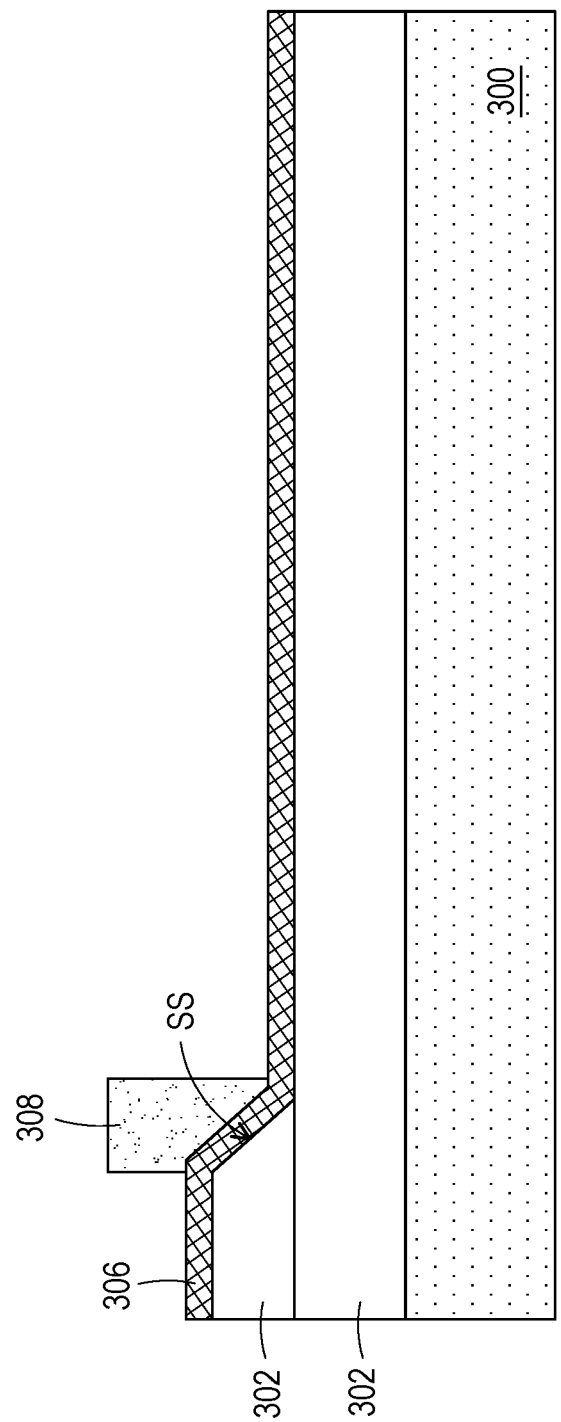

Referring to FIG. 2 and FIG. 3G, at a step S212, a mask pattern 308 is formed on the reflective layer 306. The mask pattern 308 is positioned on the sloped sidewall SS of the topmost dielectric layer 302. Accordingly, portions of the reflective layer 306 extending along the sloped sidewall SS are covered by the mask pattern 308, while other portions of the reflective layer 306 may still be exposed. As an example, the mask pattern 308 is a photoresist pattern, and a coating process as well as a lithography process may be used for forming the mask pattern 308.

Figure 3H:
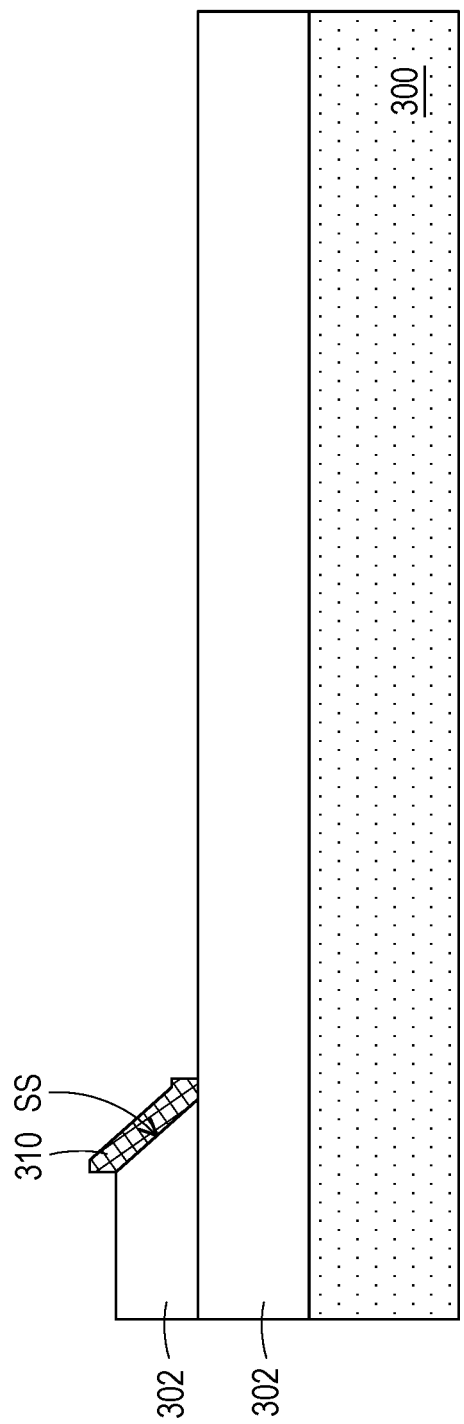

Referring to FIG. 2 and FIG. 3H, at a step S214, the reflective layer 306 is patterned to form a tilted reflector 310 extending along the sloped sidewall SS of the topmost dielectric layer 302. The tilted reflector 310 can be any one of the tilted reflectors $MR_{110}$, $MR_{102}$. An etching process may be performed for patterning the reflective layer 306. During the etching process, portions of the reflective layer 306 not being covered by the mask pattern 308 are removed, whereas portions of the reflective layer 306 overlapped with the mask pattern 306 remain to form the tilted reflector 310. As the tilted reflector 310 is formed, the mask pattern 308 may be removed by a stripping process or an ashing process.

Up to here, the tilted reflector 310 as any one of the tilted reflectors $MR_{110}$, $MR_{102}$ has been formed. Processes for forming each photonic die 110 and the interposer 102 may respectively include forming a plurality of the tilted reflectors 310 at the same or different heights, and may each include other process steps. In regarding manufacturing of each photonic die 110, pairs of the waveguide $WG_{110}$ and the grating coupler GC as well as the photodetectors PD may be formed aside the tilted reflectors 310. For instance, at least some of the waveguides $WG_{110}$, the grating couplers GC and the photodetectors PD may be formed on an exposed top surface of the dielectric layer 302 lying below the tilted reflector 310. Formation of these optical devices may involve a deposition and multiple lithography processes and etching processes. In addition to formation of these optical devices, more dielectric layers may be further stacked, and conductive features may be disposed in these dielectric layer for electrical routings. Afterwards, the bonding layer 128p and the bonding pads 130p are formed on the dielectric stack, for establishing bonding with one of the electronic dies 112. Moreover, the substrate 300 may be thinned from back side. Optionally, the substrate 300 may be entirely removed.

Similarly, manufacturing of the interposer 102 may further include formation of the waveguides $WG_{102}$. Each of the waveguides $WG_{102}$ is laterally adjacent to a pair of the tilted reflectors 310 by opposite ends. As an example, the waveguides $WG_{102}$ may be formed on an exposed top surface of the dielectric layer 302 lying below the tilted reflector 310. In addition to formation of the waveguides $WG_{102}$, more dielectric layers may be further stacked, and conductive features may be disposed in these dielectric layers for electrical routings. Moreover, in some embodiments, the through substrate vias 146 may be formed through the substrate 300 to reach the conductive features in the dielectric stack. In other embodiments, the substrate 300 may be removed, and the through substrate vias 146 may be omitted or replaced by through dielectric vias extending in the dielectric stack.

On the other hand, manufacturing of each electronic die 112 may include performing a front-end-of-line (FEOL) process including a series of process steps for forming the active devices 116 at the front surface of the semiconductor substrate 114, and include performing a back-end-of-line (BEOL) process including a series of process steps for forming the stack of dielectric layers 122 and the interconnecting elements 124 spreading in the stack of dielectric layers 122. After formation of the dielectric layers 122 and the interconnecting element 124, the bonding layer 128e and the bonding pads 130e may be further formed to define a bonding surface of the electronic die 112. In some embodiments, the ARC 126f may also be formed at the front surface of the semiconductor substrate 114 before the BEOL process, and after or during the FEOL process. As the processes performed on the front side of the semiconductor substrate 114 have been completed, the resulted structure may be flipped over, then the lens 118 may be formed at the back surface of the semiconductor substrate 114. In some embodiments, the ARC 126b is further formed to cover the back surface of the semiconductor substrate 114.

During a packaging process, the electronic dies 112 and the photonic dies 110 may be hybrid bonded to form the die stacks 100, and the die stacks 100 may be attached to the front side of the interposer 102 via the electrical connectors 104. In some embodiments, the dielectric layer 150 is filled in a spacing between the die stacks 100 and the interposer 102 after the attachment. Further, the gap filling material 106 is provided on the interposer 102 to laterally encapsulate the die stacks 100.

Figure 4A:
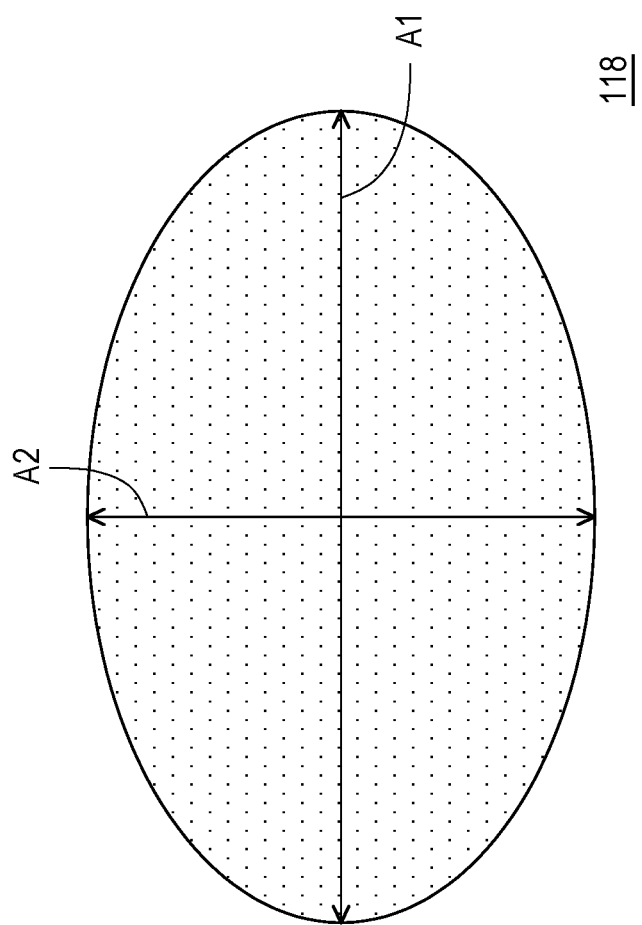
FIG. 4A is a schematic plan view of a convex lens in the semiconductor package for collimating optical beams, according to some embodiments of the present disclosure.
Figure 4B:
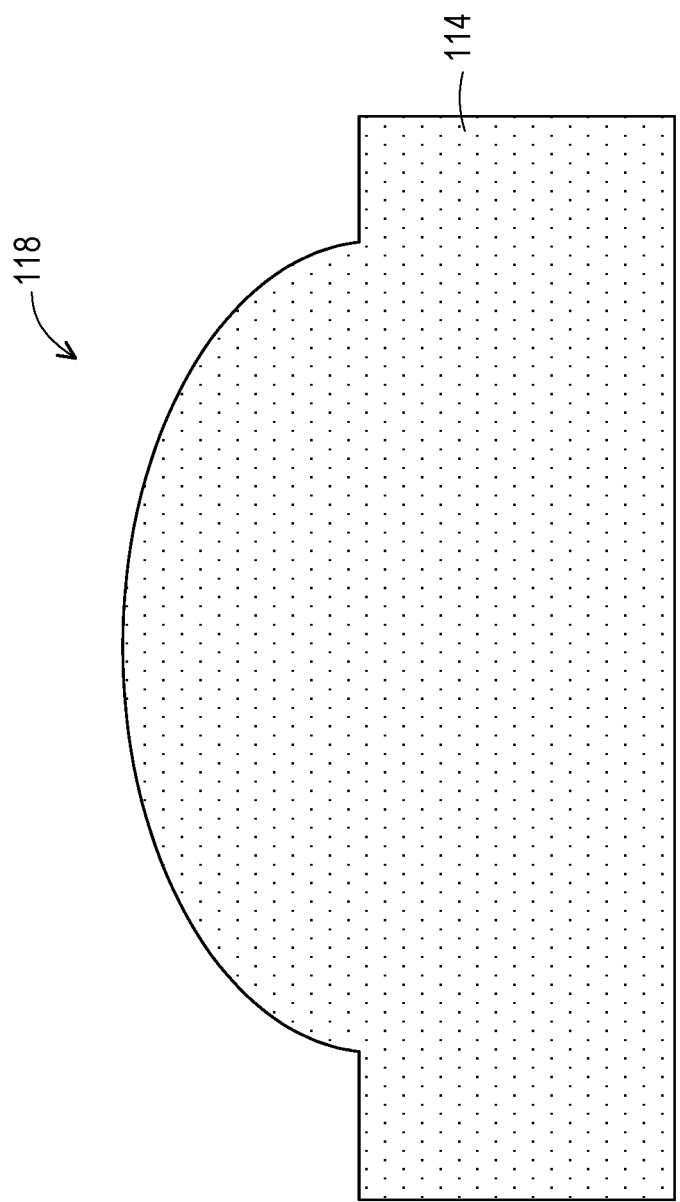
FIG. 4B is a schematic cross-sectional view of the convex lens, according to some embodiments of the present disclosure.

FIG. 4A is a schematic plan view of one of the lens 118 at the back surface of the semiconductor substrate 114 in one of the electronic dies 112, according to some embodiments of the present disclosure. FIG. 4B is a schematic cross-sectional view of the lens 118 shown in FIG. 4A, according to some embodiments of the present disclosure.

Referring to FIG. 4A, in some embodiments, each lens 118 is formed in an oval shape. In these embodiments, each lens 118 has a long axis A1 and a short axis A2 substantially perpendicular to the long axis A1. The long axis A1 is defined as a longest diameter of the lens 118, with two ends at the most widely separated points of the lens 118. On the other hand, the short axis A2 is defined as a shortest diameter of the lens 118, with two ends at the least separated points of the lens 118. When the lens 118 is highly symmetrical, the long axis A1 and the short axis A2 may intersect at a center of the lens 118. A ratio of the long axis A1 with respect to the short axis A2 is carefully controlled that an optical beam can be collimated to have a circular beam shape, as passing through the lens 118. For instance, optical beam from one of the optical fibers 120 can be collimated by a corresponding lens 118, so as to have a circular beam shape until reaching the underlying grating coupler GC. As compared to receiving an optical beam with oval beam shape, the grating coupler GC receiving the optical beam with circular beam shape can couple the optical beam to the connected waveguide $WG_{110}$ with a higher coupling efficiency. As an example, a ratio of the long axis A1 with respect to the short axis A2 may be greater than 1, and less than or equal to 1.5. If each lens 118 is formed in a circular shape with a single diameter, an optical beam being collimated by such lens 118 may have oval beam shape. As described above, the grating coupler GC may have a lower coupling efficiency while receiving an optical beam with oval beam shape.

Referring to FIG. 4B, each lens 118 at back side of the semiconductor substrate 114 in one of the electronic dies 112 has a convex surface protruding from a planar surface of the semiconductor substrate 114. As will be described, a series of process steps are involved for shaping each semiconductor substrate 114 to form the lens 118 thereon.

Figure 5:
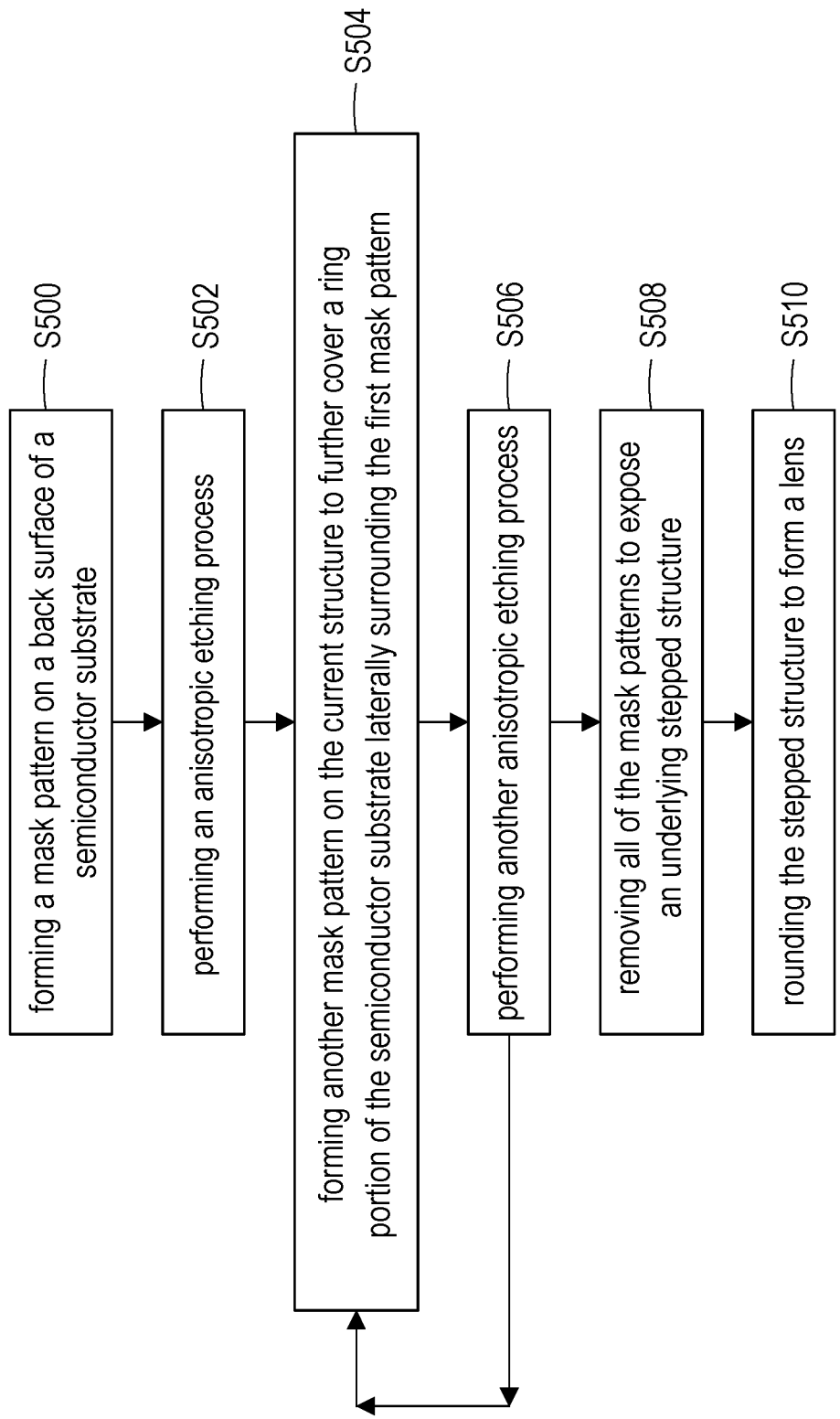
FIG. 5 is a flow diagram illustrating a process for forming the convex lens, according to some embodiments of the present disclosure.

FIG. 5 is a flow diagram illustrating a process for forming one of the lens 118, according to some embodiments of the present disclosure. FIG. 6A through FIG. 6J are schematic cross-sectional views illustrating intermediate structures at various stages during the process as shown in FIG. 5. It should be noted that, the front surface of the semiconductor substrate 114 may have been processed before the process performed on the back surface of the semiconductor substrate 114 for forming the lens 118, and the structure at the front surface of the semiconductor substrate 114 is omitted from illustration in FIG. 6A through FIG. 6J.

Figure 6A:
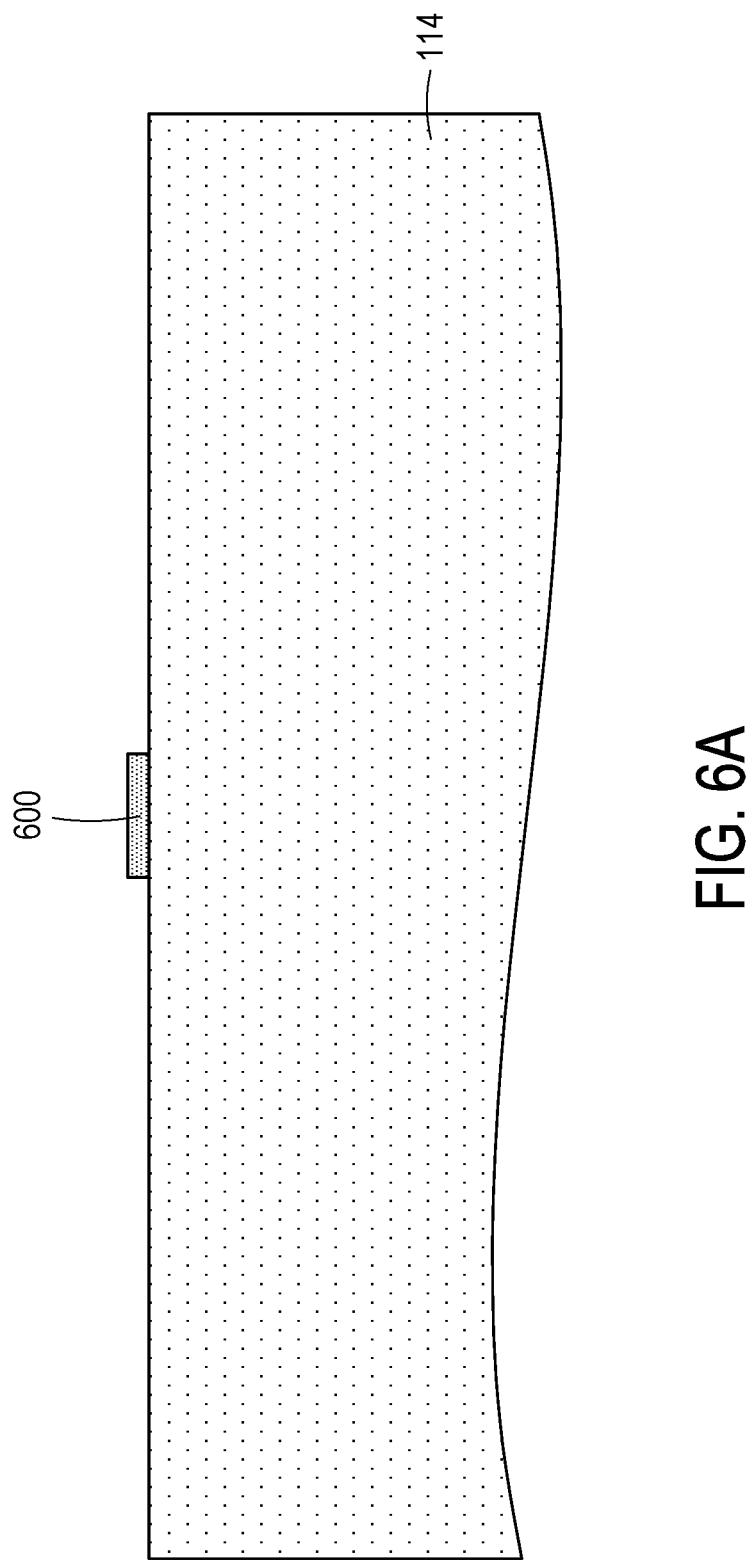

Referring to FIG. 5 and FIG. 6A, at a step S500, a mask pattern 600 is formed on the back surface of the semiconductor substrate 114. The mask pattern 600 has an oval top-view shape as identical with the lens 118 to be formed, but is smaller in size as compared to the lens 118. In some embodiments, the mask pattern 600 may be a hard mask pattern formed of silicon nitride. A method for forming the hard mask pattern may include a deposition process (e.g., a CVD process) for forming a blanket layer, and include a lithography process and an etching process for patterning the blanket layer to form the hard mask pattern. In alternative embodiments, the mask pattern 600 may be a photoresist pattern, and a method for forming the photoresist pattern may include a coating process and a following lithography process.

Referring to FIG. 5 and FIG. 6B, at a step S502, an anisotropic etching process is performed. As a result, portions of the semiconductor substrate 114 not being covered by the mask pattern 600 are recessed with respect to a portion of the semiconductor substrate 114 shielded by the mask pattern 600, and a mesa structure is resulted. As the mask pattern 600 is formed in an oval shape, the mesa structure may also have an oval boundary.

Figure 6C:
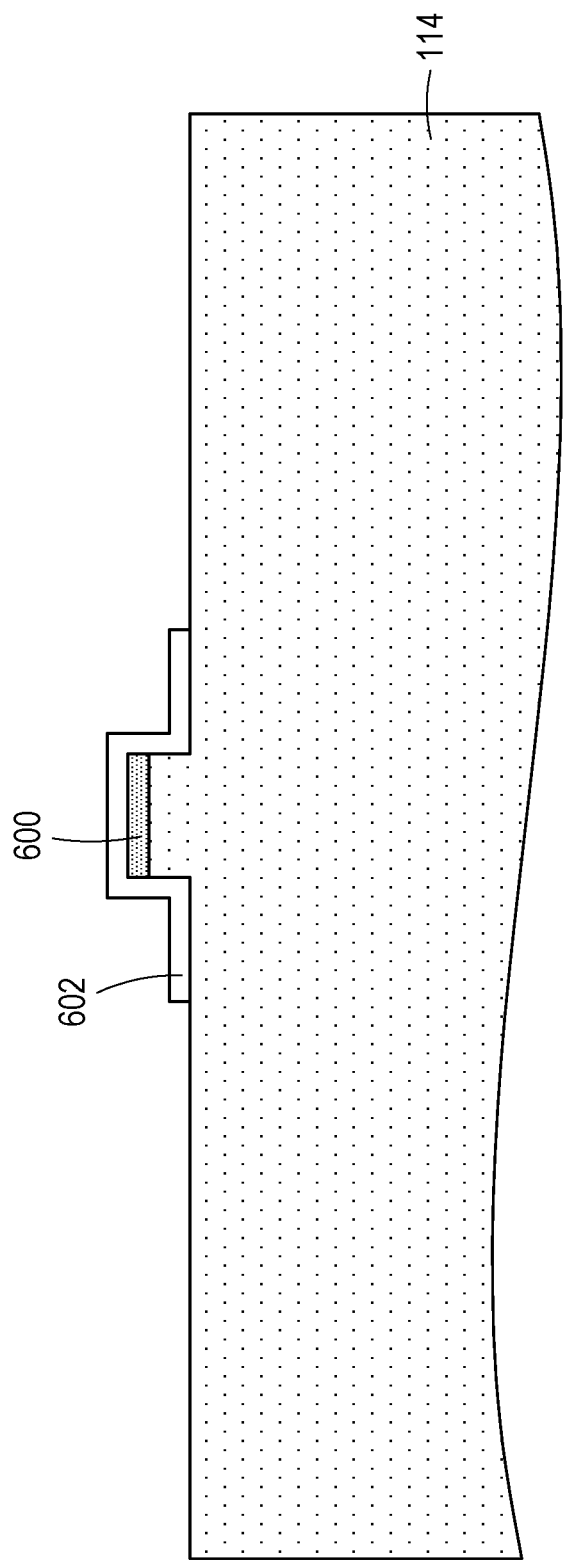

Referring to FIG. 5 and FIG. 6C, at a step S504, another mask pattern 602 is formed on the current structure, such that a ring portion of the semiconductor substrate 114 laterally surrounding the mesa structure is covered by the mask pattern 602. As similar to the mask pattern 600, the mask pattern 602 may be a hard mask pattern or a photoresist pattern. According to some embodiments, the mask pattern 602 is an oval pattern as identical with the lens 118 to be formed, but is smaller in size as compared to the lens 118, and larger in size as compared to the mask pattern 600. In these embodiments, the mask pattern 602 further covers the mesa structure and the overlying mask pattern 600. In alternative embodiments, the mask pattern 602 is an oval ring pattern laterally surrounding the mesa structure and the mask pattern 600.

Figure 6D:
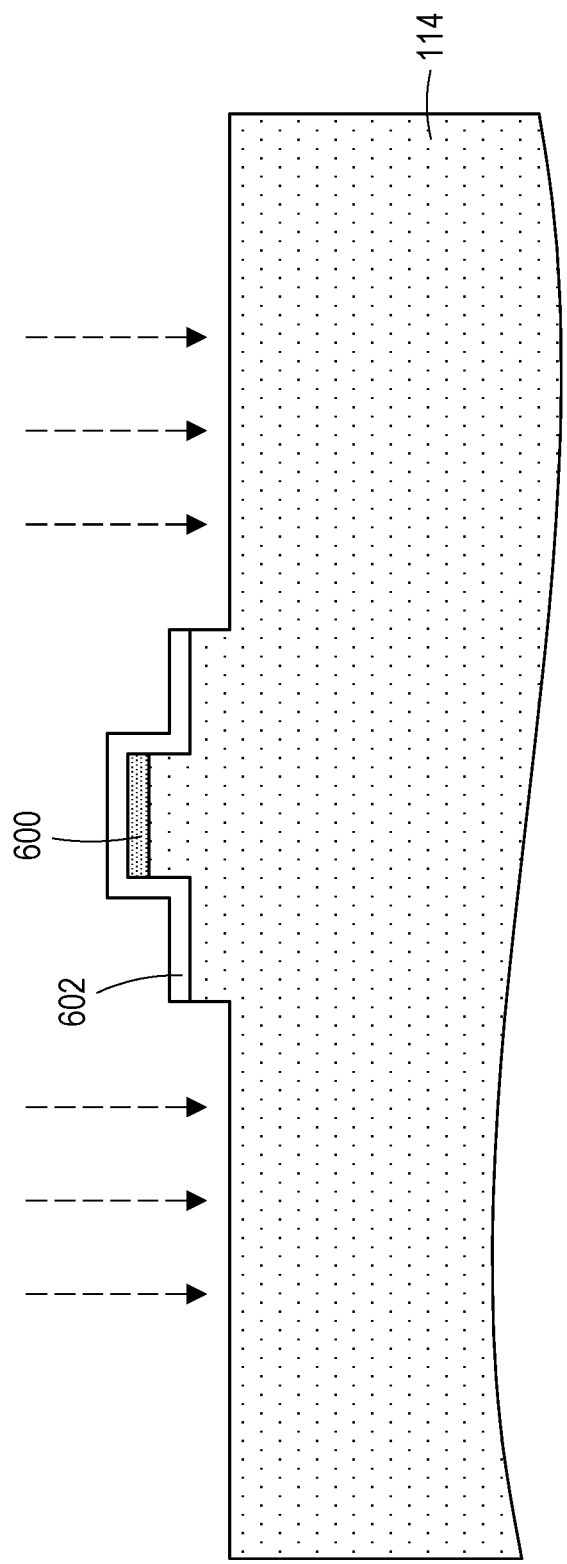
Figure 6E:
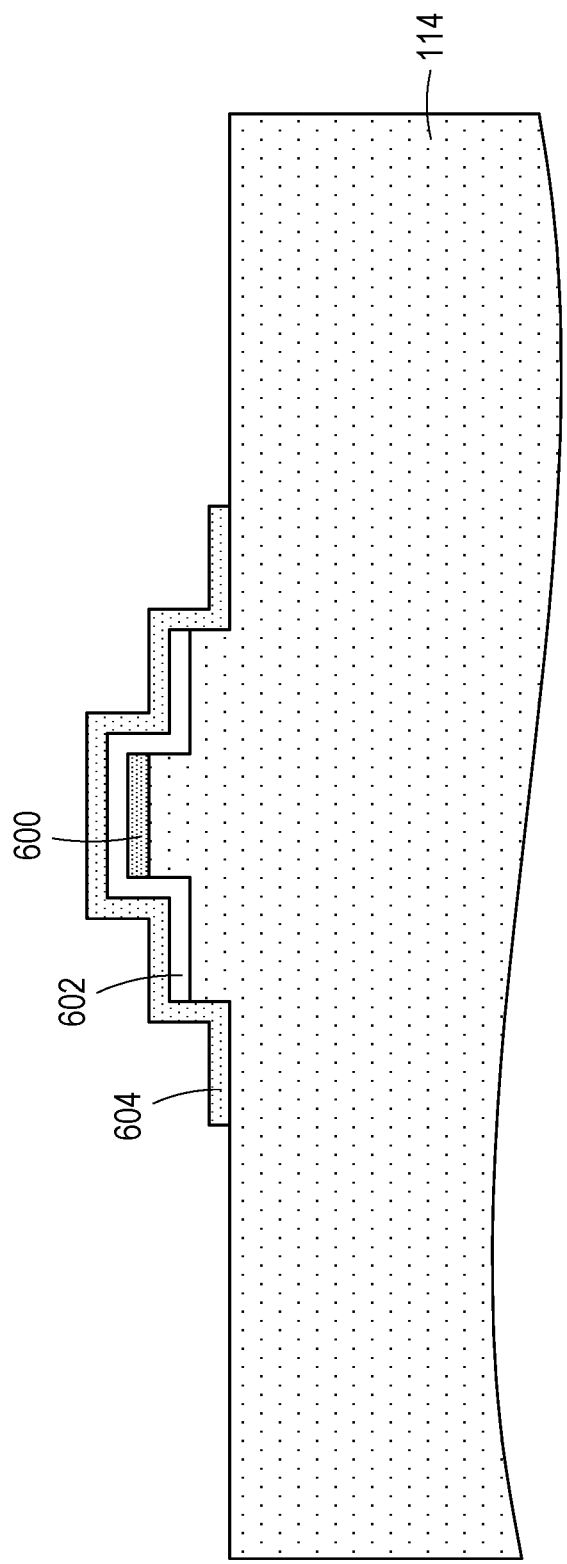
Figure 6F:
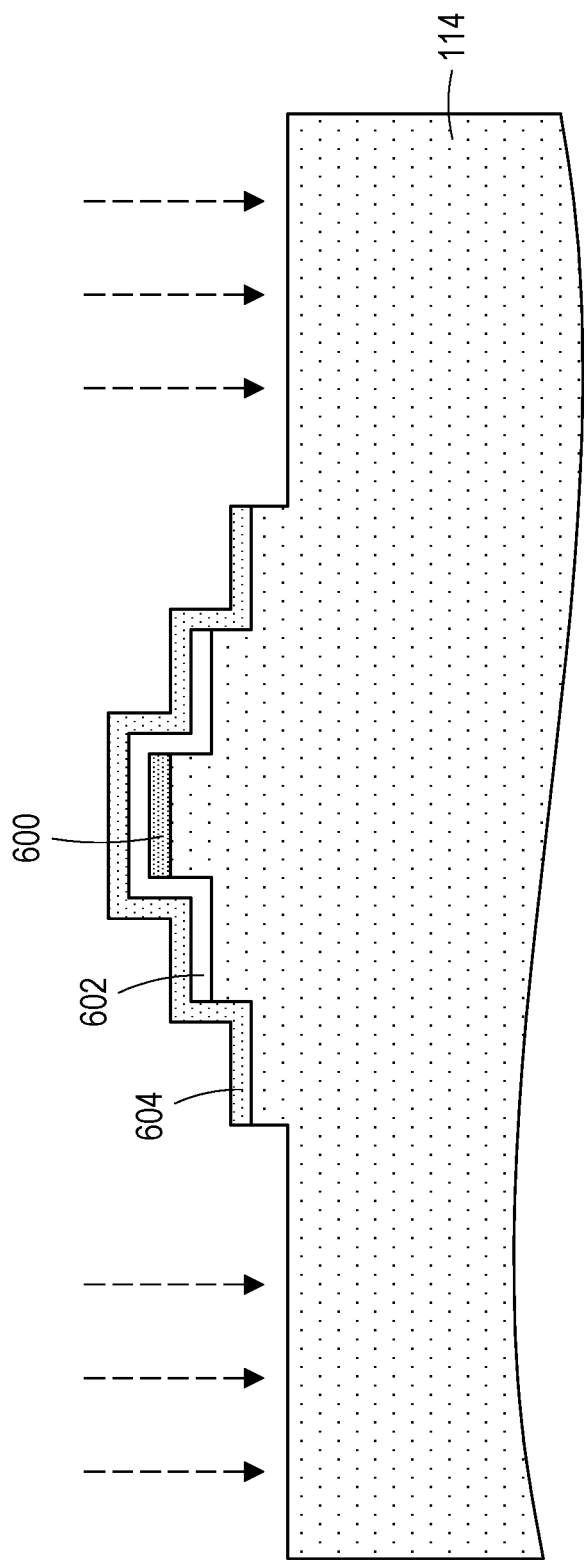
Figure 6G:
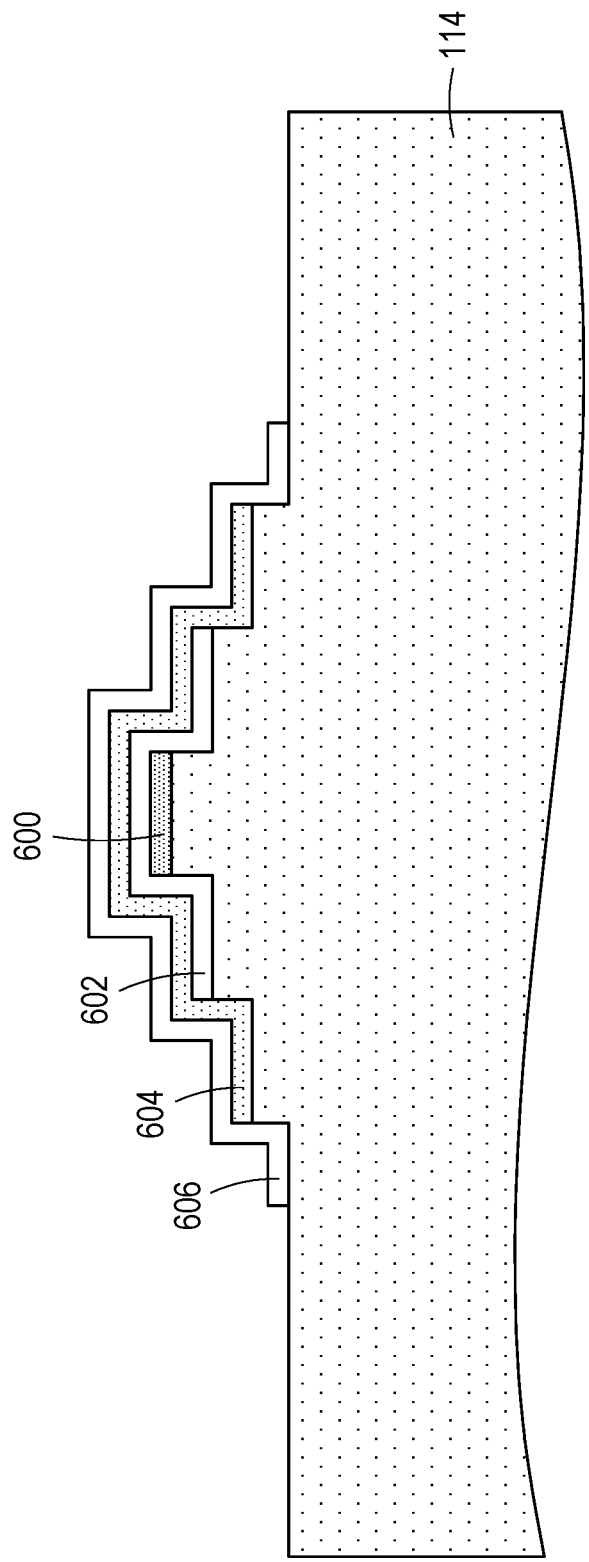
Figure 6H:
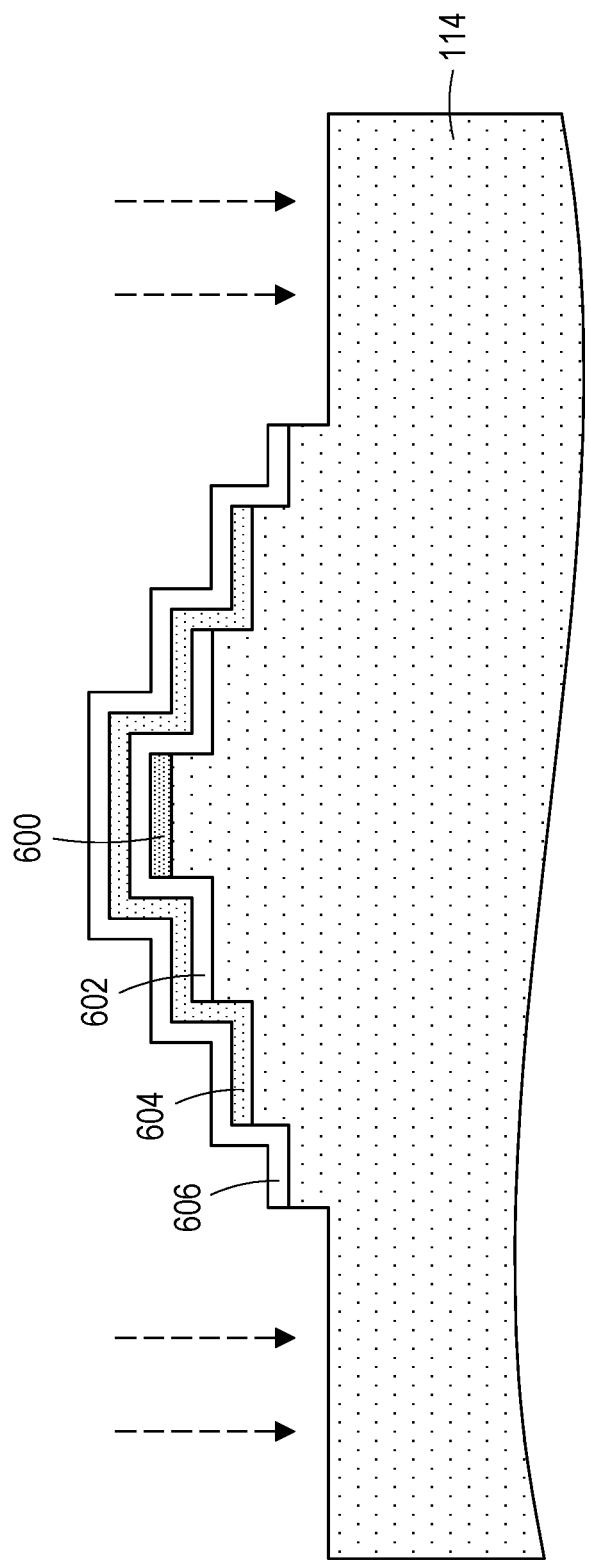

Referring to FIG. 5 and FIG. 6D, at a step S506, another anisotropic etching process is performed. As a consequence, portions of the semiconductor substrate 114 not being covered by any of the mask patterns 600, 602 are recessed with respect to portions of the semiconductor substrate 114 shielded by the mask patterns 600, 602. So far, the portions of the semiconductor substrate 114 not being covered by any of the mask patterns 600, 602 have been recessed twice, while the ring portion of the semiconductor substrate 114 only covered by the mask pattern 602 have been recessed once, and the portion of the semiconductor substrate 114 right below the mask pattern 600 have not been subjected to any recessing. Therefore, a stepped structure is resulted. The portions of the semiconductor substrate 114 not being covered by any of the mask patterns 600, 602 define a ground level of the stepped structure; the portion of the semiconductor substrate 114 lying right below the mask pattern 600 define a top level of the stepped structure; and the ring portion of the semiconductor substrate 114 only covered by the mask pattern 602 define an intermediate level of the stepped structure.

Referring to FIG. 5 and FIG. 6E through FIG. 6H, a sequence of the steps S504, S506 is repeated at least one time, to form more steps into the semiconductor substrate 114. As an example, such sequence may be repeated twice, and additional mask patterns 604, 606 are used. The mask patterns 604, 606, which may respectively be a hard mask pattern or a photoresist pattern, each provide a greater coverage over the semiconductor substrate 114. By performing additional etching processes using the mask patterns 604, 606 as shieldings, two more steps are formed into the semiconductor substrate 114.

Figure 6I:
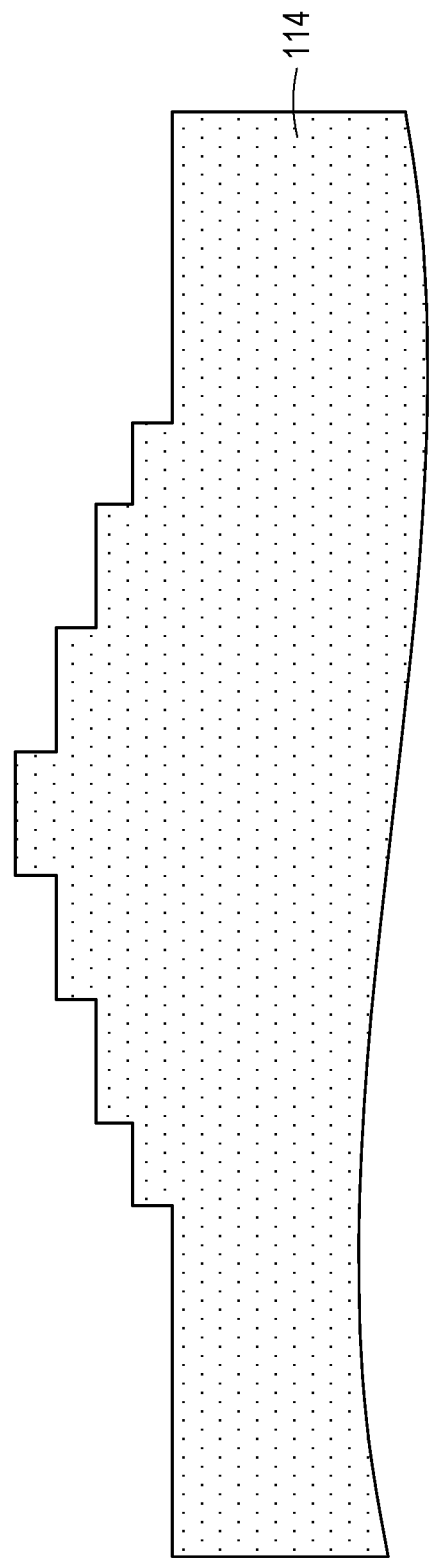

Referring to FIG. 5 and FIG. 6I, at a step S508, all of the mask patterns (e.g., the mask patterns 600, 602, 604, 606) are removed. As a consequence, the stepped structure defined at the back surface of the semiconductor substrate 114 is revealed. In those embodiments where the mask patterns are hard mask patterns, an isotropic etching process may be used for removing the mask patterns. On the other hand, in those embodiments where the mask patterns are photoresist patterns, a stripping process or an ashing process may be involved in removal of the mask patterns.

Figure 6J:
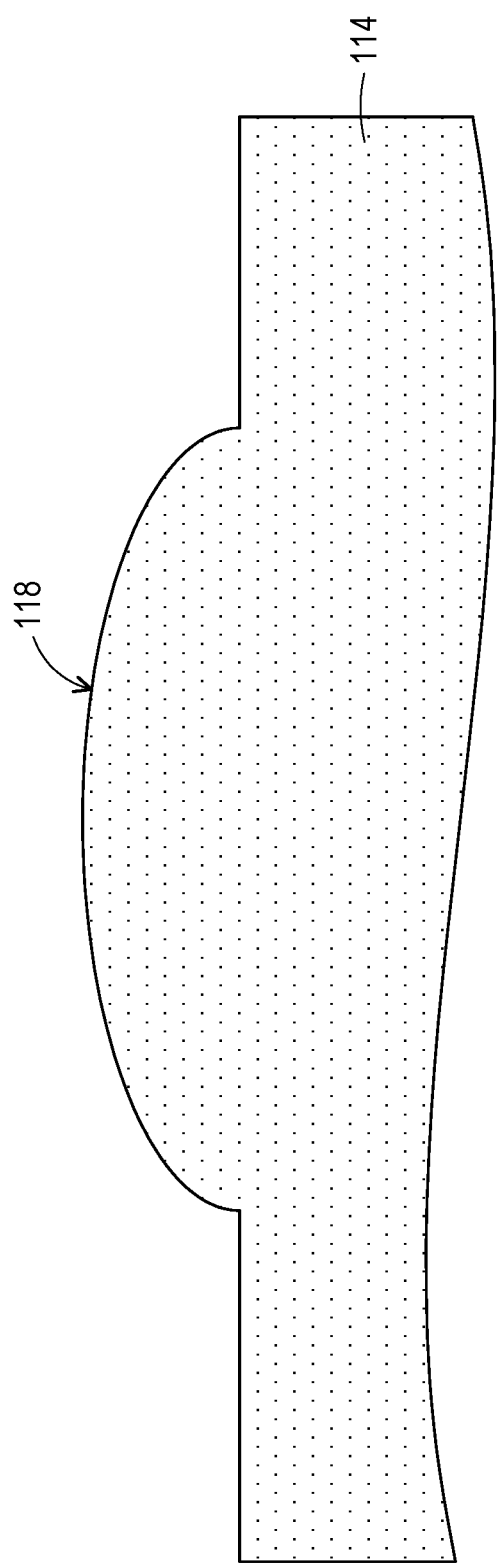

Referring to FIG. 5 and FIG. 6J, at a step S510, the stepped structure is rounded, to form the lens 118. At least one isotropic etching process may be used for rounding the stepped structure.

According to the embodiments described above, multiple mask patterns are used for shaping the back surface of the semiconductor substrate 114 into a stepped structure, then the stepped structure is rounded to form the lens 118. As will be further described, in alternative embodiments, a single mask pattern is used for shaping the back surface of the semiconductor substrate 114 into the stepped structure.

Figure 7:
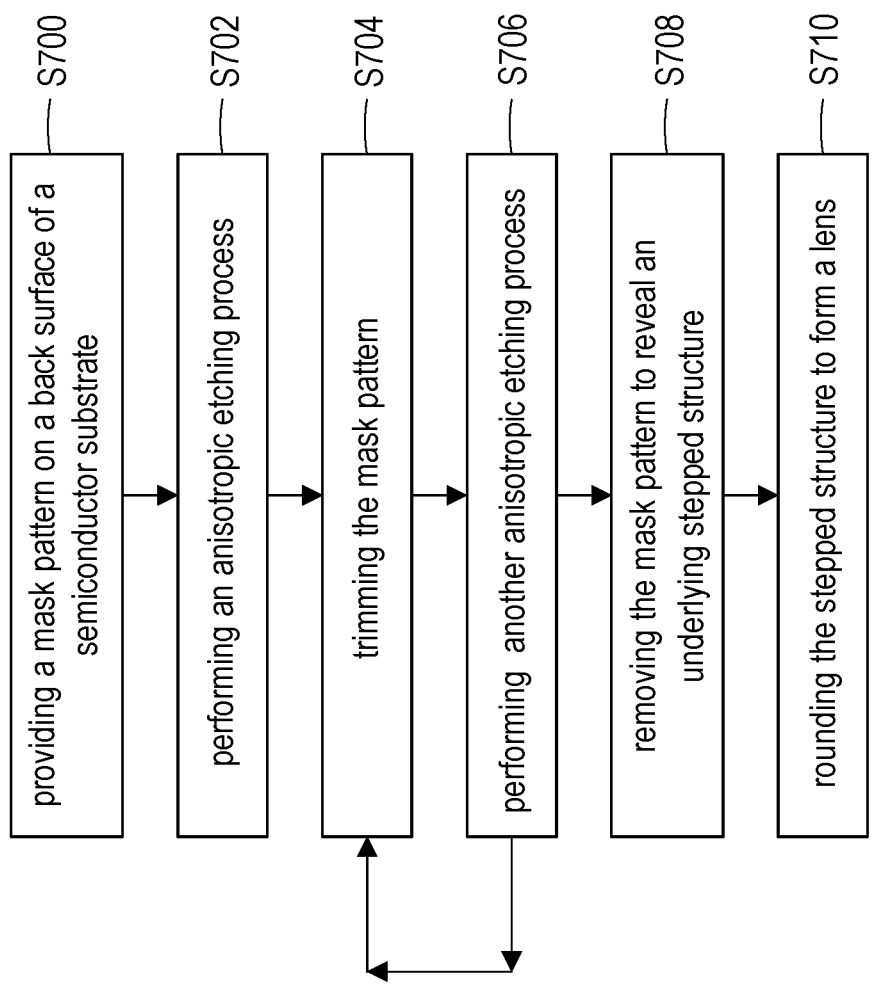
FIG. 7 is a flow diagram illustrating an alternative process for forming the convex lens, according to some embodiments of the present disclosure.

FIG. 7 is a flow diagram illustrating a process for forming one of the lens 118 at the back surface of the semiconductor substrate 114 in one of the electronic dies 112, according to some embodiments of the present disclosure. A schematic cross-sectional view of an intermediate structure at one of the steps during the process shown in FIG. 7 and a schematic plan view of the mask pattern in the intermediated structure are shown in each of FIG. 8A through FIG. 8H. It should be noted that, the front surface of the semiconductor substrate 114 may have been processed before the process for forming the lens 118, and the structure at the front surface of the semiconductor substrate 114 is omitted from illustration in FIG. 8A through FIG. 8H.

Referring to FIG. 7 and FIG. 8A, at a step S700, a mask pattern 800 is provided on the back surface of the semiconductor substrate 114. The mask pattern 800 is a photoresist pattern, and a method for providing the mask pattern 800 includes a coating process and a following lithography process. In addition, the mask pattern 800 is formed in an oval shape, as substantially identical with the lens 118 to be eventually formed.

Figure 8B:
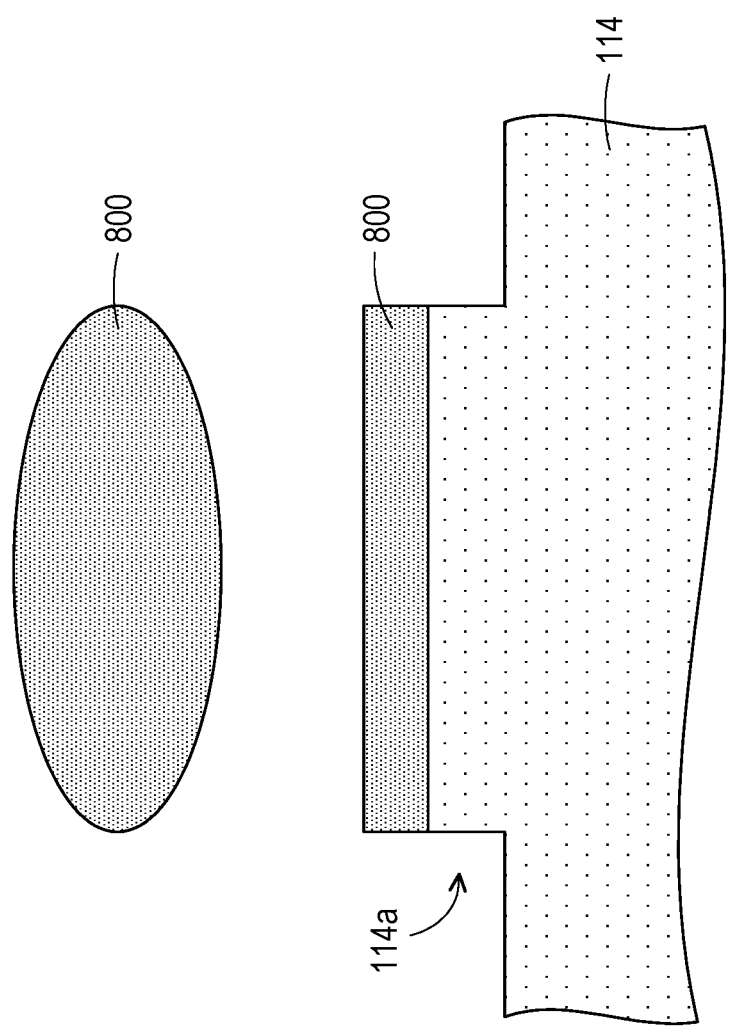

Referring to FIG. 7 and FIG. 8B, at a step S702, an anisotropic etching process is performed by using the mask pattern 800 as a shielding. Consequently, portions of the semiconductor substrate 114 not being covered by the mask pattern 800 are recessed with respect to a portion of the semiconductor substrate 114 shielded by the mask pattern 800, and a mesa structure 114a is resulted. As the mask pattern 800 is formed in an oval shape, the mesa structure 114a may also have an oval boundary.

Figure 8C:
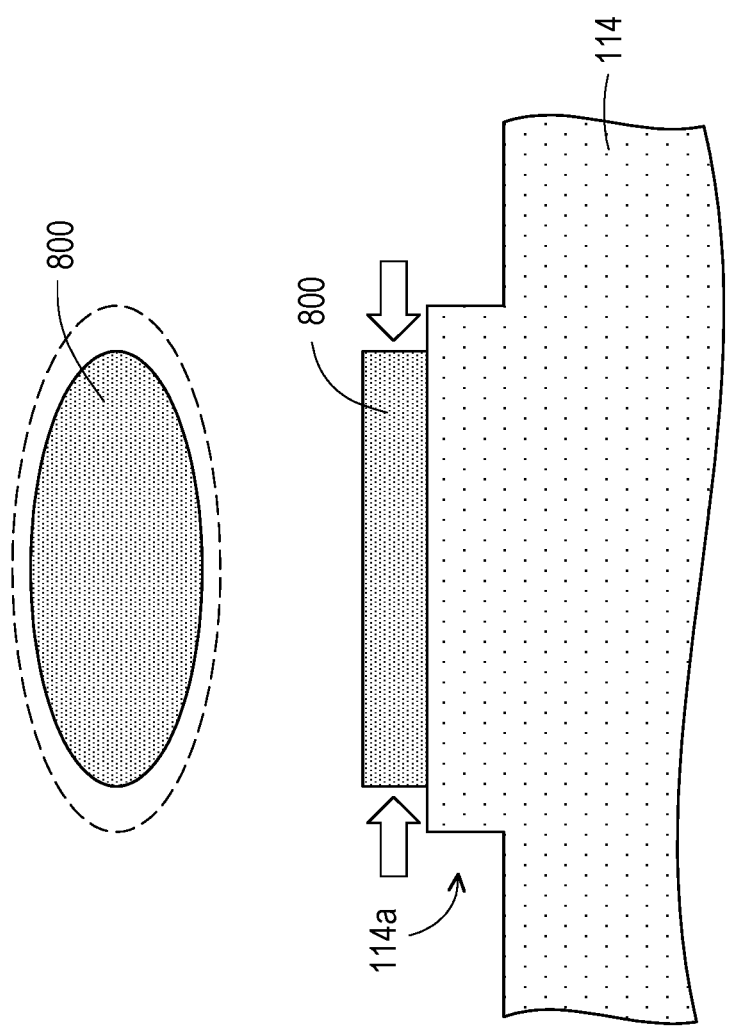
Figure 8E:
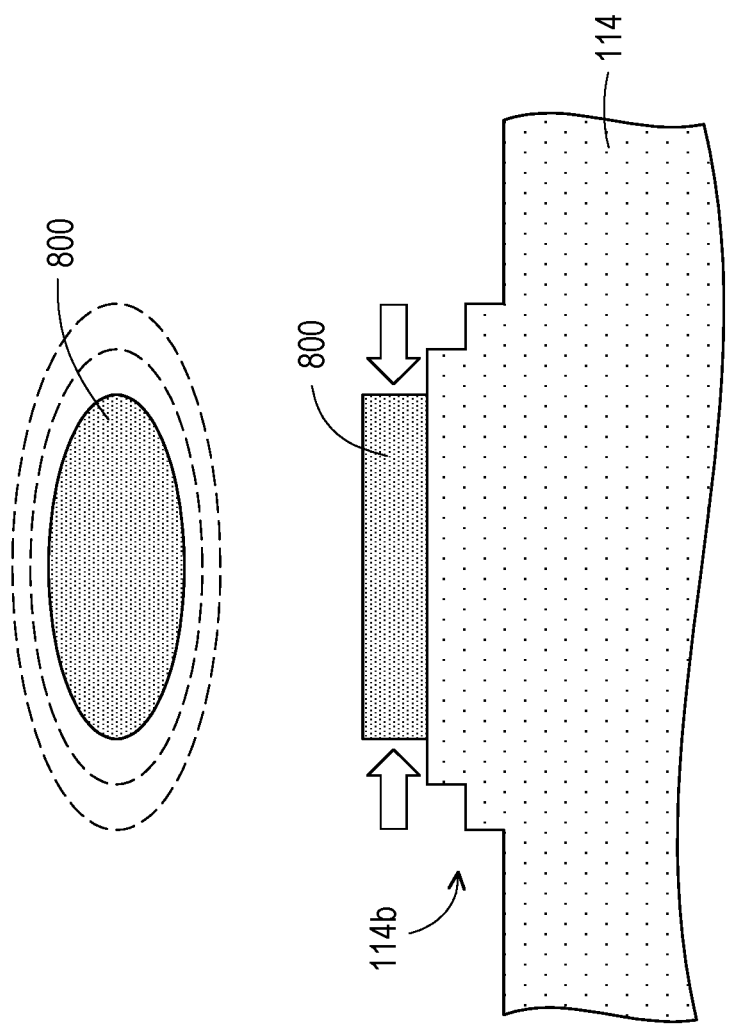
Figure 8F:
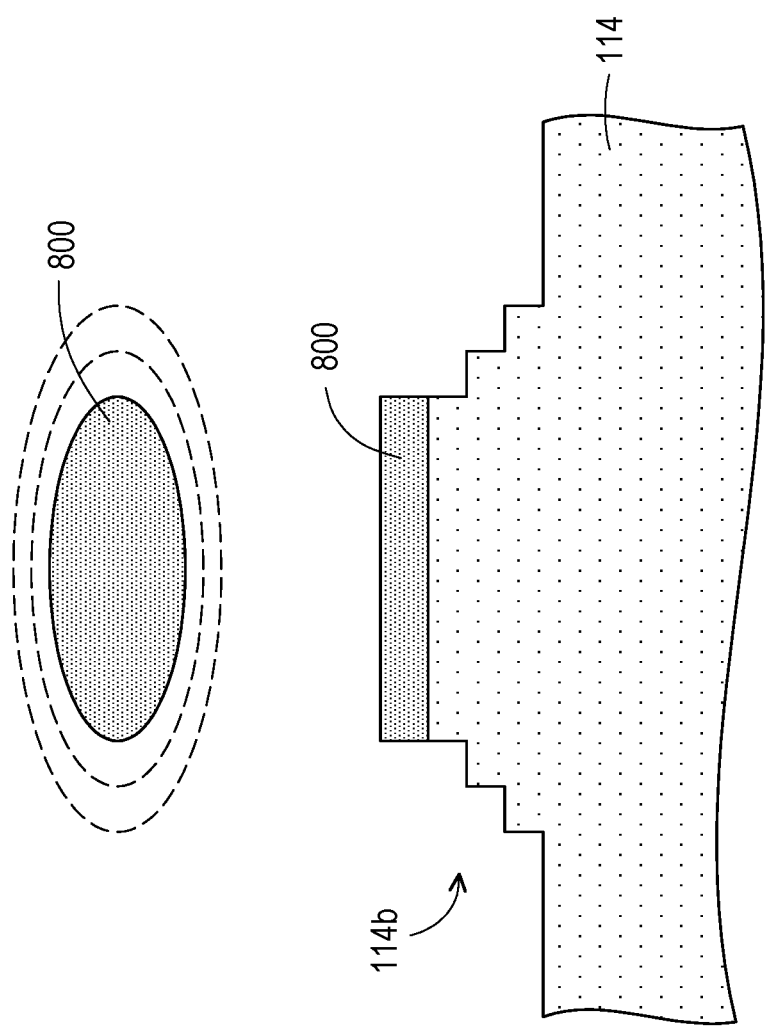
Figure 8G:
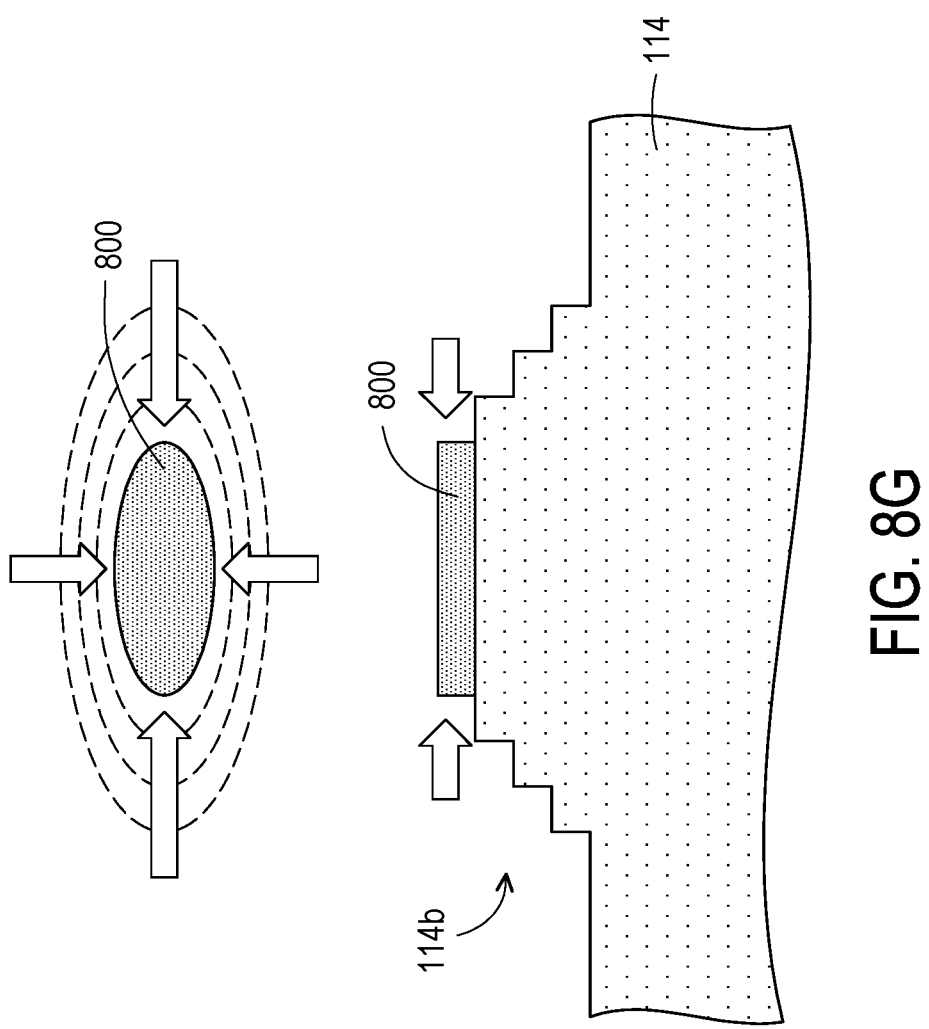

Referring to FIG. 7 and FIG. 8C, at a step S704, the mask pattern 800 is trimmed as being laterally recessed. The thick arrows shown in FIG. 8C indicate a direction along which the mask pattern 800 is lateral recessed. Further, as shown in the plan view of the mask pattern 800 in FIG. 8C, the lateral recess of the mask pattern 800 (indicated by a removed portion of the mask pattern 800 with a boundary depicted by a dash line) is substantially isotropic, that the mask pattern 800 maintains its oval shape. Although not shown, the mask pattern 800 may be thinned during the lateral recessing. As a result of laterally recessing the mask pattern 800, a peripheral portion of the mesa structure 114a is revealed.

Referring to FIG. 7 and FIG. 8D, at a step S706, another anisotropic etching process is performed. As a consequence, portions of the semiconductor substrate 114 around the mesa structure 114a as well as the peripheral portion of the mesa structure 114a are recessed with respect to other portions of the mesa structure 114a that are shielded by the mask pattern 800. So far, the portions of the semiconductor substrate 114 around the mesa structure 114a have been recessed twice, while the peripheral portion of the mesa structure 114a has been recessed once, and the portions of the mesa structure 114a right below the mask pattern 800 have not been subjected to any recessing. Therefore, a stepped structure 114b is resulted. The most etched portions of the semiconductor substrate 114 define a ground level of the stepped structure 114b; the least etched portions (or the never etched portions) of the semiconductor substrate 114 define a top level of the stepped structure 114b; and the portions of the semiconductor substrate 114 subjected to an intermediate level of etching define an intermediate level of the stepped structure 114b.

Referring to FIG. 7 and FIG. 8E through FIG. 8H, a sequence of the steps S704, S706 is repeated at least one time, for further shaping the stepped structure 114b to have more steps. For instance, the sequence including trimming the mask pattern 800 and performing an etching process using the mask pattern 800 as a shielding is repeated twice, and the stepped structure 114b is shaped to have two more steps.

Before the next step, a step S708 is performed for removing the mask pattern 800, and the resulting structure would be similar to the structure as shown in FIG. 6I. A possible method for removing the mask pattern 800 may include a stripping process or an ashing process.

After removal of the mask pattern 800, the step S510 described with reference to FIG. 5 and FIG. 6J is performed, such that the stepped structure 114b is rounded, to form the lens 118. At least one isotropic etching process may be involved for routing the stepped structure 114b.

As described, the lens 118 can be formed by using multiple mask patterns or by using only one mask pattern. In either cases, multiple anisotropic etching processes are performed by using the mask pattern(s), for forming a stepped structure to be rounded for forming the lens 118. As compared to only using isotropic etching processes for forming a lens at a back surface of a semiconductor substrate, the above-described methods including mask pattern(s) involved anisotropic etching processes exhibit better control over dimensions of the eventually formed lens 118, such that the lens 118 can be formed in the designed oval shape with certain ratio of long axis and short axis. Further, the above-described methods also result in better control of curvature of the lens 118, as compared to the method only using isotropic etching processes.

Figure 9:
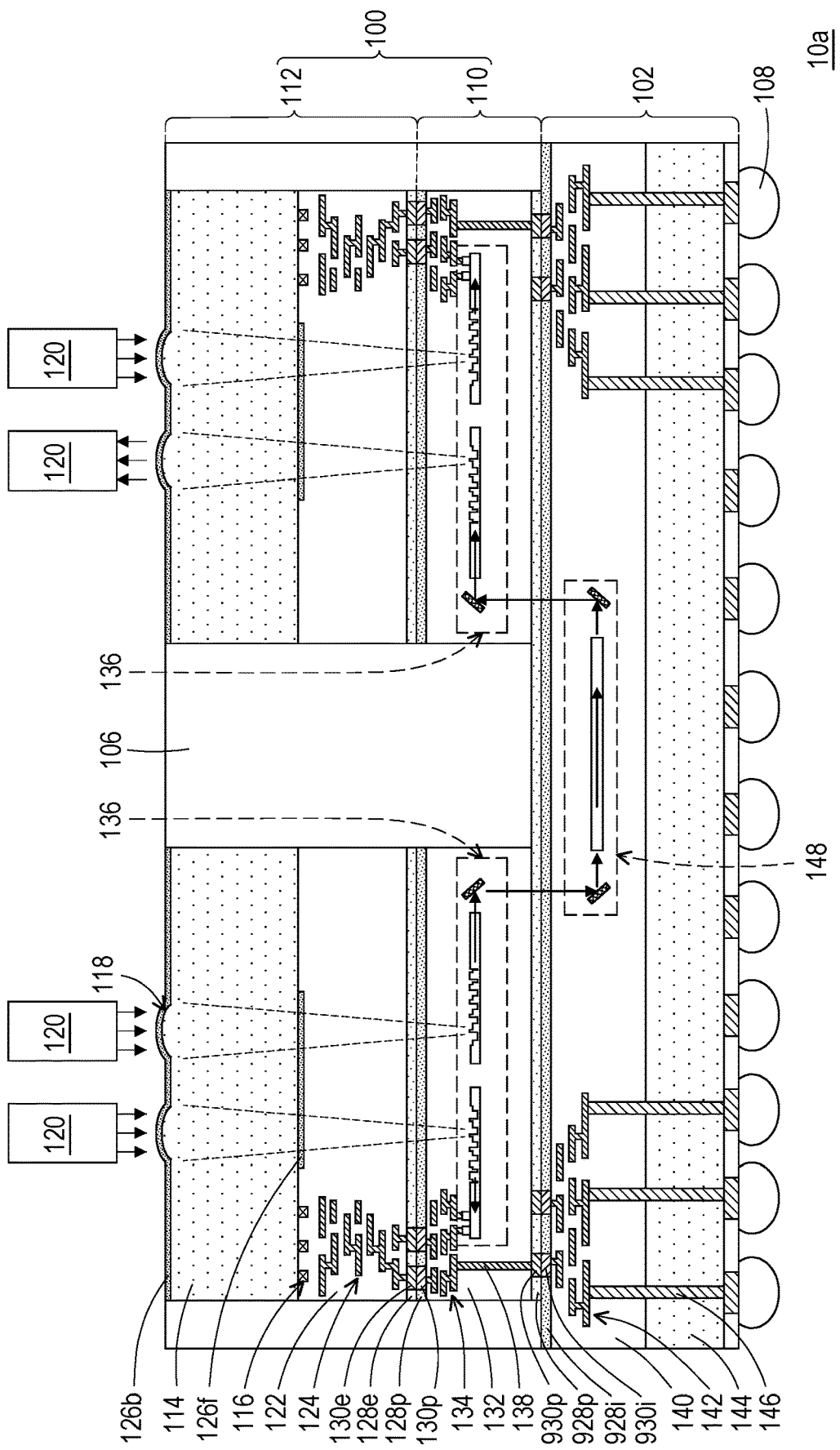
FIG. 9 is a schematic cross-sectional view illustrating a semiconductor package, according to some other embodiments of the present disclosure.

FIG. 9 is a schematic cross-sectional view illustrating a semiconductor package 10a, according to some embodiments of the present disclosure.

The semiconductor package 10a is identical with the semiconductor package 10 as shown in FIG. 1A, except that the photonic dies 110 and the interposer 102 in the semiconductor package 10a are attached via a hybrid bonding manner. As shown in FIG. 9, in addition to the bonding layer 128p and the bonding pads 130p at a front side of each photonic die 110, a bonding layer 928p and bonding pads 930p laterally surrounded by the bonding layer 928p are disposed along a back side of each photonic die 110. In those embodiments where a semiconductor substrate is absent in each photonic die 110, the bonding layer 928p lies along a back side of the stack of dielectric layers 132 in each photonic die 110, and are connected to the interconnecting elements 134 via the through dielectric vias 138. In alternative embodiments where a semiconductor substrate is involved in each photonic die 110, the bonding layer 928p may extend along a back side of the semiconductor substrate in each photonic die 110, and may be connected to the interconnecting elements 134 embedded in the stack of dielectric layers 132 via through substrate vias (not shown). On the other hand, a bonding layer 928i and bonding pads 930i laterally surrounded by the bonding layer 728i are disposed along a front side of the interposer 102. The stack of dielectric layers 140 in the interposer 102 are covered by the bonding layer 928i, and the conductive features 142 embedded in the stack of dielectric layers 140 are electrically connected to the bonding pads 930i.

During a hybrid bonding process, the bonding layers 928p of the photonic dies 110 are bonded to the bonding layer 928i of the interposer 102. In addition, the bonding pads 930p of the photonic dies 110 are bonded to the bonding pads 930i of the interposer 102, respectively. In these embodiments that the photonic dies 110 are in direct contact to the interposer 102, the electrical connectors 104 and the dielectric layer 150 disposed between the photonic dies 110 and the interposer 102 may be omitted. Therefore, optical signals traveling between the photonic dies 110 and the interposer 102 may pass through the bonding layers 928p, 928i, rather than the dielectric layer 150.

Figure 10:
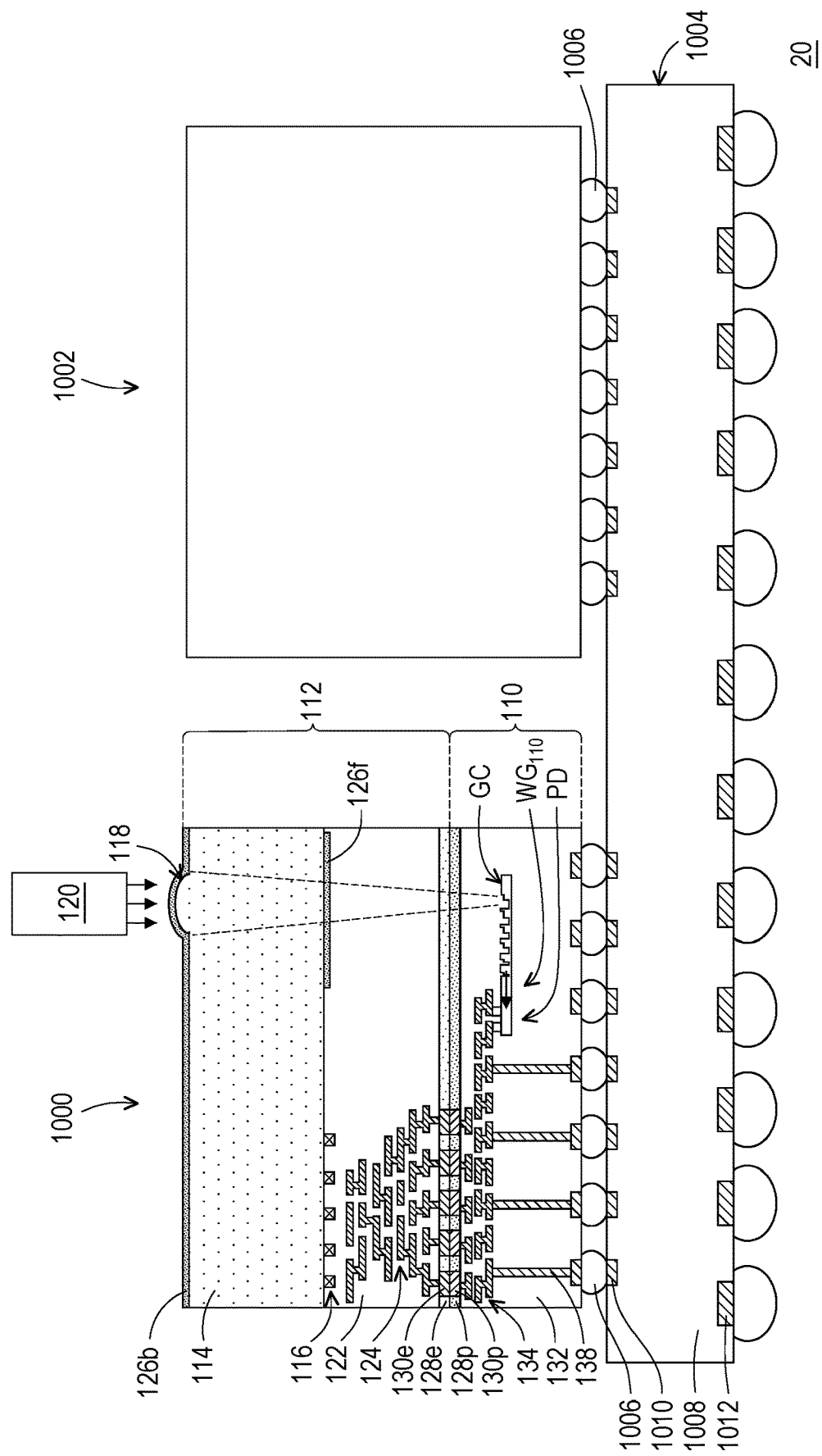
FIG. 10 is a schematic cross-sectional view illustrating a semiconductor package, according to further embodiments of the present disclosure.

FIG. 10 is a schematic cross-sectional view illustrating a semiconductor package 20, according to some embodiments of the present disclosure.

As similar to the semiconductor packages 10, 10a described with reference to FIG. 1A and FIG. 9, the semiconductor package 20 includes oval lens (i.e., the lens 118) for improving coupling efficiency. As a major difference from the semiconductor packages 10, 10a, die-to-die optical communication is absent in the semiconductor package 20.

As shown in FIG. 10, the semiconductor package 20 includes at least one die stack 1000, a device die 1002 and a package substrate 1004 supporting and attached with the die stack 1000 and the device die 1002. Electrical connectors 1006 may be used for establishing electrical and physical connection between the die stack 1000 and the package substrate 1004, and between the device die 1002 and the package substrate 1004. As an example, the electrical connectors 1006 may be C4 bumps.

The die stack 1000 is similar to one of the die stacks 100 described with reference to FIG. 1A, except that the photonic die 110 in the die stack 1000 does not include the tilted reflectors $MR_{110}$ for sending optical signals to an external package component. An optical beam carrying optical signals is emitted from an optical fiber 120 positioned on a lens 118 at a back surface of a semiconductor substrate 114 in the electronic die 112 of the die stack 1000. As being collimated by the lens 118, the optical beam may penetrate through the electronic die 112, then enter the photonic die 110 bonded to the electronic die 112. A grating coupler GC in the photonic die 110 couples the optical signals carried by the optical beam, to the connected waveguide $WG_{110}$. In some embodiments, the optical signals are further converted to electrical signals by a photodetector PD connected to the waveguide $WG_{110}$. In these embodiments, the electrical signals may be routed to the electronic die 112 through interconnecting elements 134 connected to the photodetector PD, and/or routed to the package substrate 1004 through the interconnecting elements 134, through dielectric vias 138 connecting the interconnecting elements 134 to a back side of the photonic die 110, and some of the electrical connectors 1006 arranged between the photonic die 110 and the package substrate 1004. In other embodiments, the optical signals can be processed by other optical devices in the photonic die 110, rather than being directly converted to electrical signals.

On the other hand, the device die 1002 laterally spaced apart from the die stack 1000 may be an electronic die. As an example, the device die 1002 may be an application specific integrated circuit (ASIC) die. In some embodiments, the device die 1002 is bonded to the package substrate 1004 via a flip chip manner. In these embodiments, an active side of the device die 1002 (a side where active devices and interconnecting elements are disposed) faces toward the package substrate 1004, and in contact with the electrical connectors 1006 disposed between the device die 1002 and the package substrate 1004.

The package substrate 1004 may include a stack of dielectric layers 1008, and include conductive pads 1010 embedded in topmost one of the dielectric layers 1008 as well as conductive pads 1012 embedded in bottommost one of the dielectric layers 1008. The conductive pads 1010 are in contact with the electrical connectors 1006, respectively. In addition, the conductive pads 1012 at the other side of the package substrate 1004 may be in contact with electrical connectors 1014 as inputs/outputs (I/Os) of the semiconductor package 20. Although not shown, the package substrate 1004 may further include conductive features embedded in the dielectric layers 1008 and spreading between the conductive pads 1010 and the conductive pads 1012. Electrical signals from the die stack 1000 and the device die 1002 may be routed to the other side of the package substrate 1004 through the conductive pads 1010, 1012 and the conductive features in between. Further, the die stack 1000 and the device die 1002 may electrically communicate with each other through the conductive pads 1010 and the conductive features.

Since die-to-die optical communication is absent in the semiconductor package 20, the photonic die 110 may not send optical signals to the package substrate 1004, and the package substrate 1004 may not include tilted reflectors and waveguides (as similar to the tilted reflectors $MR_{102}$ and the waveguides $WG_{102}$ described with reference to FIG. 1A and FIG. 1C) for further directing the optical signals.

As above, a semiconductor package and a manufacturing method thereof are provided. According to various embodiments, a lens at an outer surface of the semiconductor package and functioned for collimating optical beams is formed in an oval shape (top-view shape), such that each optical beam collimated by the lens has a circular beam shape, rather than having an oval beam shape. In this way, a grating coupler in the semiconductor package can couple the collimated optical beam to a waveguide by improved coupling efficiency. In some embodiments, the semiconductor package includes laterally separated photonic dies and an interposer lying below the photonic dies. In these embodiments, the photonic dies can be optically communicated with one another through the underlying interposer. Particularly, tilted reflectors are disposed in the photonic dies and the interposer, and are configured to deflect light. An optical signal traveling along a lateral direction in one of the photonic dies can be re-directed to a vertical direction by a tilted reflector in this photonic die, thus can leave this photonic die then enter the underlying interposer along the vertical direction. Correspondingly, a tilted reflector in the interposer may catch this optical signal and deflect it to a lateral direction, so as to be carried along a waveguide in the interposer. Another tilted reflector at the other side of the waveguide may re-direct this optical signal to leave the interposer and enter another one of the overlying photonic dies along a vertical direction. In this way, optical signals can be directed from one of the photonic dies to another, without being subjected to any optical-electrical conversion. Therefore, the optical communication between the photonic dies can be provided with improved speed and energy efficiency.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

In an aspect of the present disclosure, a semiconductor package is provided. The semiconductor package comprises: a photonic die, comprising a first waveguide and a first tilted reflector laterally adjacent to the first waveguide; an electronic die, stacked on the photonic die and bonded to the photonic die by a front side; an interposer, lying below and attached with a die stack having the photonic die and the electronic die, and comprising a second waveguide and a pair of second tilted reflectors at opposite ends of the second waveguide, wherein lateral optical paths are established along the first and second waveguides, and a vertical optical path is established between the first reflector and one of the second tilted reflectors.

In another aspect of the present disclosure, a semiconductor package is provided. The semiconductor package comprises: photonic dies, each comprising a stack of dielectric layers and optical devices embedded in the stack of dielectric layers, wherein the optical devices in each photonic die comprise: a grating coupler; a first waveguide, connecting to an end of the grating coupler; and a first tilted reflector, laterally adjacent to the first waveguide. The semiconductor package further comprises: an interposer, lying below and attached with the photonic dies, and comprising a second waveguide and a pair of second tilted reflectors at opposite ends of the second waveguide. The first tilted reflector in a first one of the photonic dies and a first one of the second tilted reflectors in the interposer are configured that an optical signal emitted from the first waveguide and deflected by the first tilted reflector in the first one of the photonic dies propagates to the first one of the second tilted reflectors in the interposer and is re-directed to the second waveguide by the first one of the second tilted reflectors. A second one of the second tilted reflectors in the interposer and the first tilted reflector in a second one of the photonic dies are configured that an optical signal emitted from the second waveguide and deflected by the second one of the second tilted reflectors propagates to the first tilted reflector in the second one of the photonic dies, and is re-directed by the first tiled reflector to the first waveguide in the second one of the photonic dies.

In yet another aspect of the present disclosure, a manufacturing method of a semiconductor package is provided. The method comprises: attaching a die stack comprising a photonic die and an overlying electronic die on an interposer, wherein the photonic die comprises a first waveguide and a first tilted reflector laterally adjacent to the first waveguide, the interposer comprises a second waveguide and a pair of second tilted reflectors at opposite ends of the second waveguide, lateral optical paths are established along the first and second waveguides, and a vertical optical path is established between the first reflector and one of the second tilted reflectors. A method for forming each of the first tilted reflector and the second tilted reflectors comprises: providing a dielectric pattern; shaping the dielectric pattern, such that a peripheral portion of the dielectric pattern is shaped to form a staircase structure; smoothing out the staircase structure, to form a sloped sidewall at a side of the dielectric pattern; forming a reflective layer to cover the dielectric pattern; and patterning the reflective layer, to result a portion of the reflective layer remained along the sloped sidewall of the dielectric pattern, for forming a tilted reflector as any one of the first and second tilted reflectors.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor package, comprising:
a photonic die, comprising a first waveguide and a first tilted reflector laterally adjacent to the first waveguide;
an electronic die, stacked on the photonic die and bonded to the photonic die by a front side;
an interposer, lying below and attached with a die stack having the photonic die and the electronic die, and comprising a second waveguide and a pair of second tilted reflectors at opposite ends of the second waveguide, wherein lateral optical paths are established along the first and second waveguides, and a vertical optical path is established between the first reflector and one of the second tilted reflectors.

2. The semiconductor package according to claim 1, wherein the electronic die is attached to the photonic die via dielectric-to-dielectric bonding and metal-to-metal bonding.

3. The semiconductor package according to claim 1, wherein the electronic die comprises a semiconductor substrate with a front surface facing toward the photonic die and a back surface facing away from the photonic die, and a convex lens is formed at the back surface of the semiconductor substrate.

4. The semiconductor package according to claim 3, wherein the convex lens is a protruding portion of the semiconductor substrate.

5. The semiconductor package according to claim 3, wherein the convex lens is formed in an oval top-view shape.

6. The semiconductor package according to claim 5, wherein the convex lens has a long axis and a short axis substantially perpendicular to the long axis, and a ratio of a length of the long axis with respect to a length of the short axis is greater than 1, and equal to or less than 1.5.

7. The semiconductor package according to claim 3, further comprising an optical fiber positioned on the convex lens.

8. The semiconductor package according to claim 3, further comprising:
- a first anti-reflection coating, covering the convex lens; and
- a second anti-reflection coating, covering the front surface of the semiconductor substrate, and overlapped with the first anti-reflection coating.

9. The semiconductor package according to claim 1, further comprising:
- an insulating gap filling material, formed on the interposer and laterally surrounding the die stack.

10. The semiconductor package according to claim 1, wherein the photonic die is free of a semiconductor substrate.

11. A semiconductor package, comprising:
- photonic dies, each comprising a stack of dielectric layers and optical devices embedded in the stack of dielectric layers, wherein the optical devices in each photonic die comprise:
  - a grating coupler;
  - a first waveguide, connecting to an end of the grating coupler; and
  - a first tilted reflector, laterally adjacent to the first waveguide; and
- an interposer, lying below and attached with the photonic dies, and comprising a second waveguide and a pair of second tilted reflectors at opposite ends of the second waveguide,
- wherein the first tilted reflector in a first one of the photonic dies and a first one of the second tilted reflectors in the interposer are configured that an optical signal emitted from the first waveguide and deflected by the first tilted reflector in the first one of the photonic dies propagates to the first one of the second tilted reflectors in the interposer and is re-directed to the second waveguide by the first one of the second tilted reflectors, and
- wherein a second one of the second tilted reflectors in the interposer and the first tilted reflector in a second one of the photonic dies are configured that an optical signal emitted from the second waveguide and deflected by the second one of the second tilted reflectors propagates to the first tilted reflector in the second one of the photonic dies, and is re-directed by the first tiled reflector to the first waveguide in the second one of the photonic dies.

12. The semiconductor package according to claim 11, wherein the first tilted reflectors in the photonic dies and the second tilted reflectors in the interposer each have a major reflective surface tilted from a vertical axis by an angle greater than 0° and less than 90°.

13. The semiconductor package according to claim 12, wherein the major reflective surface of the first one of the second tilted reflectors and the major reflective surface of the first tilted reflector in the first one of the photonic dies are tilted from the vertical axis counterclockwise, and the major reflective surface of the second one of the second tilted reflectors as well as the major reflective surface of the first tilted reflector in the second one of the photonic dies are tilted from the vertical axis clockwise.

14. The semiconductor package according to claim 11, wherein the first tilted reflector in the first one of the photonic dies and the first one of the second tilted reflectors are in mirror symmetry with the first tilted reflector in the second one of the photonic dies and the second one of the second tilted reflectors, with respect to a central axis between the first and second ones of the photonic dies.

15. The semiconductor package according to claim 11, wherein the first one of the second tilted reflectors is overlapped with the first tilted reflector in the first one of the photonic dies, and the second one of the second tilted reflectors is overlapped with the first tilted reflector in the second one of the photonic dies.

16. The semiconductor package according to claim 11, wherein the photonic dies are attached to the interposer via bump electrical connectors.

17. The semiconductor package according to claim 16, further comprising:
- a dielectric layer, extending along a spacing between the photonic dies and the interposer, and is overlapped with the first tilted reflectors in the photonic dies and the second tilted reflectors in the interposer.

18. The semiconductor package according to claim 11, wherein the photonic dies are attached to the interposer via dielectric-to-dielectric bonding and metal-to-metal bonding.

19. A manufacturing method of a semiconductor package, comprising:
- attaching a die stack comprising a photonic die and an electronic die on an interposer, wherein the electronic die is stacked on the photonic die and bonded to the photonic die by a front side, the photonic die comprises a first waveguide and a first tilted reflector laterally adjacent to the first waveguide, the interposer lies below and is attached with the die stack, the interposer comprises a second waveguide and a pair of second tilted reflectors at opposite ends of the second waveguide, lateral optical paths are established along the first and second waveguides, a vertical optical path is established between the first reflector and one of the second tilted reflectors, and a method for forming each of the first tilted reflector and the second tilted reflectors comprises:
  - providing a dielectric pattern;
  - shaping the dielectric pattern, such that a peripheral portion of the dielectric pattern is shaped to form a staircase structure;
  - smoothing out the staircase structure, to form a sloped sidewall at a side of the dielectric pattern;
  - forming a reflective layer to cover the dielectric pattern; and
  - patterning the reflective layer, such that a portion of the reflective layer remains along the sloped sidewall of the dielectric pattern, for forming a tilted reflector as any one of the first and second tilted reflectors.

20. The manufacturing method of the semiconductor package according to claim 19, further comprising:
- shaping a back surface of the electronic die to form a lens at the back surface, comprising:
  - forming a mask pattern on the back surface;
  - etching the back surface by using the mask pattern as an etching mask;
  - trimming the mask pattern, to remove a peripheral portion of the mask pattern;
  - repeating the etching and the following trimming at least one time, to form a stepped structure at the back surface;
  - removing the mask pattern, to expose the stepped structure; and
  - rounding the stepped structure, to form the lens.

* * * * *